United States Patent [19]

Webb

[11] Patent Number: 5,360,973

[45] Date of Patent: Nov. 1, 1994

[54] MILLIMETER WAVE BEAM DEFLECTOR

[75] Inventor: George W. Webb, Del Mar, Calif.

[73] Assignee: Innova Laboratories, Inc., San Diego, Calif.

[21] Appl. No.: 899,756

[22] Filed: Jun. 17, 1992

Related U.S. Application Data

[63] Continuation-in-part of Ser. No. 484,028, Feb. 22, 1990, Pat. No. 5,159,486.

[51] Int. Cl.$^5$ .................. G01T 1/24; H01L 27/14; H01Q 15/00
[52] U.S. Cl. .................. 250/370.01; 257/428; 359/565; 342/372
[58] Field of Search ................ 250/370.01, 370.14, 250/338.4, 505.1; 257/428; 343/754; 359/298, 299, 565, 36

[56] References Cited

U.S. PATENT DOCUMENTS

| | | | |
|---|---|---|---|
| 3,569,997 | 3/1971 | Lehovec | 257/290 |
| 3,790,252 | 2/1974 | Pao | 359/299 |
| 4,190,811 | 2/1980 | Alcock et al. | 359/299 |
| 4,508,431 | 4/1984 | Henshaw | 359/299 |
| 4,541,017 | 9/1985 | Feight et al. | 358/295 |
| 4,812,756 | 3/1989 | Curtis et al. | 324/158 R |
| 5,084,707 | 1/1992 | Reits | 343/754 |
| 5,126,875 | 6/1992 | Tabuchi | 257/432 |
| 5,157,538 | 10/1992 | Soref | 359/248 |

OTHER PUBLICATIONS

Craig, et al.; "Stress Dependence of Contact Potential: The AC Kelvin Method," *Rev. Sci. Instrum.*, vol. 41:2, pp. 258–264 (1970).
Besocke, et al., "Piezoelectric Driven Kelvin Probe for Contact Potential Difference Studies," *Rev. Sci. Instrum.*, vol. 47:7, pp. 840–842 (Jul. 1976).
Wachtel, et al., "New Application of the Kelvin Method Involving the Scanning of the Bucking Voltage", *Rev. Sci. Instrum*, vol. 51:10, pp. 1421–1423 (Oct. 1980).
Baumgartner, et al.; "Micro Kelvin Probe for Local Work–Function Measurements", *Rev. Sci. Instrum.*, vol. 59:5, pp. 802–805 (May 1988).

*Primary Examiner*—Rolf Hille
*Assistant Examiner*—Robert Limanek
*Attorney, Agent, or Firm*—Fitch, Even, Tabin & Flannery

[57] ABSTRACT

A non-mechanical beam deflector forms and scans a beam of millimeter wave (MMW) radiation at a rapid rate. The beam deflector includes a semiconductor body in which a spatially varying density of charge carriers is selectively injected. The injected charge carriers—electrons and/or holes—alter the dielectric constant of the semiconductor body locally and thereby attenuate and reflect incident MMW radiation. The portions of the semiconductor body that do not have carriers injected therein allow the incident MMW radiation to be transmitted. The semiconductor body, modified with a spatially varying density of charge carriers, diffracts the radiation which passes through it into a beam. The beam may be scanned across space through selective control of the injected charge carriers. The diffractive conditions can be rapidly re-configured. The spatially varying density of charge carriers may be induced optically into the semiconductor body, or directly injected using opposing p- and n-type contacts forming a p-n junction. A dynamically variable Fresnel zone plate (FZP) represents one application of the invention.

19 Claims, 22 Drawing Sheets

$r1 + r2 = r3 + r4 + n\lambda$ $$r1 + r2 = r3 + r4 + n\lambda$$

FRONT VIEW

MILLIMETER WAVE BEAM DEFLECTOR

This application is a continuation-in-part of U.S. patent application Ser. No. 07/484,028, filed Feb. 22, 1990, now U.S. Pat. No. 5,159,486, Oct. 27, 1992, entitled INSTRUMENTATION APPARATUS AND METHODS UTILIZING PHOTOCONDUCTORS AS LIGHT-MODULATED DIELECTRICS, which application is incorporated herein by reference.

BACKGROUND OF THE INVENTION

The present invention relates to a non-mechanical millimeter wave beam (MMW) beam deflection device that forms and steers beams of electromagnetic radiation having wavelengths in the millimeter range, e.g., electromagnetic radiation having a free space wavelength of from 1 cm to 30 $\mu$m (where 1 $\mu$m = $10^{-6}$ m).

There are numerous instances where it would be desirable to form a beam of electromagnetic radiation from either transmitted or received radiation and/or to scan or steer such a beam across space. Such beam steering capability would be useful, for example, in radar, telecommunications, and other similar applications. Heretofore, beam steering devices have largely been mechanical in nature, e.g., requiring the controlled physical rotation of an antenna mounted about a pivot point. Disadvantageously, mechanical beam steering devices require extensive control circuits for effectuating the desired physical movement, are limited in their ability to quickly scan or deflect a beam, and/or have elements that are prone to wear out with use. What is needed, therefore, is a beam steering device that is easily controlled, capable of a rapid scanning rate, and that has no moving parts.

One form of beam deflection is beam diffraction. In general, diffraction is the spreading or scattering of a wave motion, e.g., light, as it passes an obstacle and expands into the region that is behind the obstacle and hence not directly exposed to the incoming waves. One type of beam diffraction device known in the art is a Fresnel zone plate. Fresnel zone plates work by blocking radiation. A path of rays from a small emitting source passes through an aperture to a detection point. The rays may add either in phase or out of phase at the detection point depending upon the particular path through which the rays passes traverse in arriving at the detection point. If those rays that add out of phase or cause destructive interference are blocked from going through the aperture, then there is a large gain in the received intensity of the wave at the detection point. Such an aperture with the necessary areas blocked to prevent destructive interference is known as a Fresnel zone plate (FZP). Unfortunately, conventional FZP's require some type of physical barrier to perform the requisite blocking function. Such physical barrier necessarily limits the applicability of the FZP to a specific type of radiation, i.e., frequency and phase. What is needed is a type of FZP wherein the requisite blocking function may be performed with a dynamically induced barrier that can rapidly change its relative location and size, thereby allowing the FZP to be used for a wide variety of applications.

SUMMARY OF THE INVENTION

The present invention advantageously addresses the above and other needs by providing a non-mechanical beam deflector that can form and scan a beam at a rapid rate. The beam deflector includes a semiconductor or photoconductor body in which a spatially varying density of charge carriers has been selectively induced. The induced charge carriers—electrons and/or holes—alter the dielectric constant of the semiconductor body locally and thereby attenuate and reflect an incident electromagnetic wave. The semiconductor material and thickness are chosen so that the parts of the semiconductor body that do not have carriers induced in them allow the incident electromagnetic wave to be transmitted. The semiconductor body, modified with a spatially varying density of charge carriers in this manner, diffracts the radiation which passes through it into a beam. The beam can be scanned across space through selective control of the induced charge carriers. Advantageously, because the semiconductor body responds rapidly to changes in conditions that produced the charge carriers, it is possible to rapidly re-configure the diffractive conditions, and thus change the beam in a desired manner.

In accordance with one aspect of the invention, the spatially varying density of charge carriers is induced optically into a photoconductor body. Advantageously, such inducement may occur at a high rate, thereby allowing the photoconductor body to function as an optically modulated beam deflection device that can, e.g., rapidly scan the beam across space.

In accordance with another aspect of the invention, a dynamically variable Fresnel zone plate (FZP) is provided wherein selective blocking of the incident radiation is achieved by optically inducing a spatially varying density of charge carriers within a photoconductor body pursuant to a prescribed pattern.

In accordance with a still further aspect of the invention, the light-modulated photoconductor is used as a mirror or lens wherein the index of refraction is optically modulated. Such light modulated lens or mirror assembly finds use in numerous applications, such as a MMW beam steering device.

One embodiment of the present invention may thus be characterized as a millimeter wave (MMW) beam deflector that includes: (1) a semiconductor body; (2) means for selectively injecting a spatially varying distribution of charge carriers injected in the semiconductor body; and (3) means for directing MMW radiation from a MMW source through the semiconductor body. In operation, the transmission of the MMW radiation through the semiconductor body is affected by the local spatial distribution of charge carriers in the semiconductor body, thereby diffracting the MMW radiation in a desired manner.

In accordance with one aspect of this embodiment of the invention, the means for selectively injecting a spatially varying distribution of charge carriers in the semiconductor body includes: (a) an array of radiative sources, where each radiative source produces illuminating electromagnetic radiation having a wavelength less than a first prescribed wavelength (i.e., high frequency radiation, such as visible or infrared light); (b) imaging means for directing the electromagnetic radiation from each of the radiative sources of the array to respective pixel areas on the semiconductor body; and (c) energizing means for controllably energizing selected groupings of the radiative sources on the array so as to direct electromagnetic radiation to selected pixel areas on the semiconductor body. In this way, charge carriers are optically induced into selected pixel areas on the semiconductor body as controlled by the energizing means; and thus the MMW radiation passing through the semiconductor body may be appropriately affected by the selected pixel areas so as to selectively control the MMW radiation in a desired manner.

In accordance with another aspect of the above-described embodiment of the invention, the means for selectively injecting a spatially varying distribution of charge carriers in the semiconductor body includes: (a) a radiative source emitting electromagnetic radiation having a wavelength less than a first prescribed wavelength (i.e., high frequency radiation, such as visible or infrared light); (b) a spatial modulator positioned between the radiative source and the semiconductor body, which spatial modulator inserts a prescribed pattern that is selectively opaque to the electromagnetic radiation between the radiative source and the semiconductor body, thereby causing the radiation emitted from the radiative source to be selectively limited to the prescribed pattern defined by the spatial modulator; (c) imaging means for directing the electromagnetic radiation passing through the spatial modulator to respective pixel areas on the semiconductor body; and (d) control means for controlling the spatial modulator in a way that creates the prescribed pattern. In this way, charge carriers are optically induced in the respective pixel areas on the semiconductor body in a manner controlled by the control means; and thus the MMW radiation passing through the semiconductor body is appropriately affected by the respective pixel areas so as to selectively control the MMW radiation.

In accordance with yet a further aspect of the above-described embodiment of the invention, the means for selectively injecting a spatially varying distribution of charge carriers in the semiconductor body includes: (a) first and second opposing two-dimensional arrays of contacts on either side of the semiconductor body; and (b) means for applying a voltage bias to selected opposing contacts of the first and second opposing arrays of contacts, which forward bias voltage causes electrons and holes to flow between the opposing contacts. In this manner, charge carriers are directly injected into the semiconductor body, forming conductive pixel areas through which the transmission of the MMW radiation is affected.

The invention may also be characterized as a method of forming a beam of millimeter wave (MMW) radiation. Such method includes: (a) directing MMW radiation through a semiconductor body; (b) injecting a spatially varying distribution of charge carriers into selected pixel areas of the semiconductor body, with the spatially varying distribution of charge carriers causing the selected pixel areas of the semiconductor body to become conductive and attenuate any MMW radiation passing therethrough; and (c) controlling the pixel areas injected with the charge carriers so as to form a prescribed attenuation pattern that creates constructive interference of the MMW radiation after the MMW radiation has passed through the semiconductor body, the constructive interference causing a beam of MMW radiation to be formed at a detection point.

It is a feature of the invention to provide a beam steering or deflection device that is easily controlled, capable of a rapid scanning rate, and that has no moving parts.

It is another feature of the invention to provide a beam steering or deflection device made from a semiconductor or photoconductor body in which a varying spatial density of charge carriers is selectively injected or induced in order to cause such device to exhibit its desired beam steering or deflection properties.

It is yet another feature of the invention to provide such a beam steering device wherein the selective inducement of charge carriers is achieved optically.

It is still another feature of the invention to provide a dynamically controllable Fransel zone plate (FZP) made from a photoconductor body wherein the requisite blocking or attenuation function of the FZP is performed by a dynamically, optically induced barrier that can rapidly change its relative location and size within the FZP body, thereby allowing such FZP to be used for a wide variety of applications.

It is a further feature of the present invention to provide an optically modulated photoconductor that serves as a non-mechanical lens or mirror used to selectively steer or guide a beam of electromagnetic radiation passing through, or reflecting from, such photoconductor.

BRIEF DESCRIPTION OF THE DRAWINGS

The above and other aspects, advantages and features of the present invention will be more apparent from the following more particular description thereof, presented in conjunction with the following drawings wherein.

DETAILED DESCRIPTION OF THE INVENTION

The following description is of the best mode presently contemplated of practicing the invention. This description is not to be taken in a limiting sense, but is made merely for the purpose of describing the general principles of the invention. The scope of the invention should be ascertained with reference to the claims.

The present invention, in accordance with one aspect thereof, relates to apparatus and methods utilizing the variable permittivity provided by a light-modulated photoconductor or similar wafer. Before describing the invention, it will thus be helpful to review some basic principles relating to photoconductors and similar materials.

A photoconductor is usually described as a material that exhibits a resistance, or conductivity, that varies in the presence of visible light, infrared, or ultraviolet radiation. Materials that exhibit such variable conductivity are thus appropriately called photoconductive materials. The property of changing resistance in accordance with impinging light intensity is called photoconductivity. Depending on the doping concentration, every photoconductive material has a band gap frequency (or band gap wavelength) associated therewith. Light, or other electromagnetic radiation, having a frequency greater than the band gap frequency (or a wavelength less than the band gap wavelength) causes the conductivity of the photoconductive material to increase when it impinges on the photoconductor.

In general, a photoconductive substance has a certain finite resistance when there is no visible light (or other electromagnetic radiation having a frequency greater than the band gap frequency) falling on it. As the intensity of the visible light or other high frequency electromagnetic radiation increases, the resistance decreases (i.e., the material becomes more conductive). There is a limit, however, to the extent that the resistance continues to decrease as the intensity of the impinging light increases.

Photoconductivity occurs in almost all normally non-conducting materials to a certain extent. However, it is much more pronounced in semiconductors. When light energy strikes a photoconductive material, the density of charge-carriers increases. Thus, current can be more easily made to flow when a voltage is applied. The more photons are absorbed by the material for a given electromagnetic wavelength, the more easily the material conducts an electric current.

Some examples of photoconductive substances are germanium, silicon, and the sulfides of various other elements. For purposes of the present invention, a preferred photoconductive materials include silicon and cadmium sulfide.

Figure 1A:
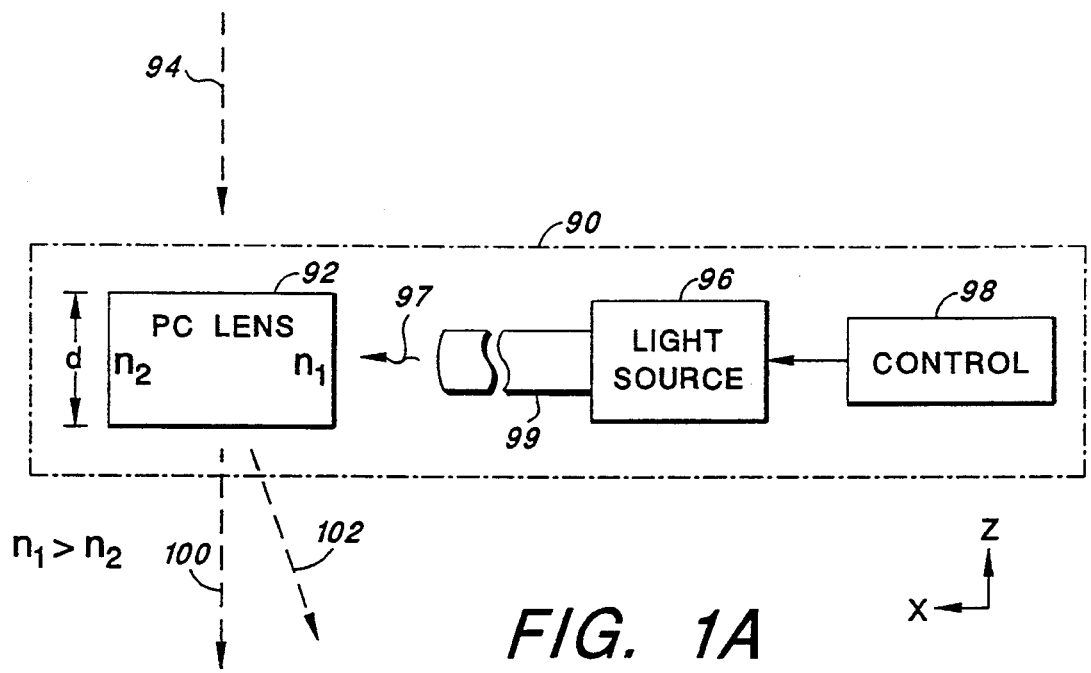
FIG. 1A is a schematic diagram of an optically modulated lens assembly.

Referring next to FIG. 1A, there is shown a schematic diagram of an optically modulated lens assembly made in accordance with one aspect of the present invention. As described in Applicant's U.S. Pat. No. 5,159,486 patent filed Feb. 22, 1990, the low frequency dielectric constant or permittivity of a photoconductor can be modulated or controlled by the absorption of visible light. The refractive index of a lens may be expressed as $$n = \epsilon^{\frac{1}{2}}. \tag{1}$$

See, e.g., Jackson, *Classical Electrodynamics*, p. 217 (John Wiley & Sons 1962). Hence, modulation of $\epsilon$ provides modulation of n. Hence, by using a suitable photoconductor as a lens or mirror through which electromagnetic radiation, such as an MMW beam, is directed, and by modulating the dielectric constant with visible light (or other high frequency electromagnetic radiation) in an appropriate manner, a tunable lens or mirror is realized that can steer or deflect the electromagnetic beam in a desired direction.

Hence, with reference to FIG. 1A, an optically tunable lens assembly 90 is made using a homogeneous body of photoconducting material 92 that is sufficiently transparent to an electromagnetic radiation beam or ray incident thereto. The beam 94 may be, for example, an MMW beam. A suitable light source 96, controlled by a control circuit 98 directs light 97 of the appropriate frequency to the photoconductor 92. If desired, a fiber optic cable 99, or an array of fiber optic cables, may be used to control the delivery of the light 97 to the photoconductive lens (PC lens) 92. In general, in the absence of a modulating light beam 97, the beam 94 passes through the PC lens 92 in accordance with a first index of refraction, thereby exiting along a first beam path, e.g., the path indicated by the dotted line 100. In the presence of a modulating light beam 97, the index of the PC lens is altered, and the beam 94 passes though the PC lens 92 in accordance with a second index of refraction, thereby exiting along a different beam path, e.g., the path indicated by the dotted line 102. Thus, selective control of the modulating beam 97 causes the beam 94 to follow exit path 100 or 102, thus providing a means of non-mechanically steering the beam 94.

The modulating beam 97 may be obtained from a stationary two-dimensional array of LED's. In the x direction, the intensity of LED's light may be modulated by varying the duty cycle of the light, using partial light absorbers, or by some other means. The index of refraction (dielectric constant or permittivity) of the PC lens 92 is modulated as a function of the amount of light 97 absorbed therein. The phase velocity, v, and wavelength $\lambda$, for a plane wave passing through the PC lens medium 92 may be expressed as:

$$v = c/n \qquad (2)$$

and $$\lambda = \lambda_{vac}/n, \qquad (3)$$

where c is the speed of light, and n is the index of refraction. In general, for two points 1 and 2 of index $n_1$ and $n_2$, their wavelengths are related by $$n_1\lambda_1 = n_2\lambda_2. \qquad (4)$$

Hence, for a graded lens 92 as shown in FIG. 1A of thickness d, the phase difference $\Delta p$ between the two points 1 and 2 of a plane wave exiting the lens is $$\begin{aligned}\Delta p &= 2\pi(d/\lambda_2 - d/\lambda_1) & (5)\\ &= 2\pi(d/\lambda_{vac})(n_2 - n_1). & (6)\end{aligned}$$

At low modulation frequencies, a modulation of $n_2=9$ and $n_1=3$ is possible. Thus, for example, assuming this modulation to hold, in the IR frequency range, and assuming a lens having a thickness d of 10 microns, Equation (6) shows that a phase shift on the order of 36 rad may be achieved for radiation having a wavelength $\lambda_{vac} = 10.6$ microns.

Scanning of the electromagnetic beam 94 may advantageously be realized by ramping the light source 96. The ultimate modulation rate for the PC lens 92 is limited by the free carrier recombination time. Recombination times exist that are faster than a microsecond for some photoconductive materials. Hence, modulation rates on the order of at least 1 MHz are possible.

Figure 1B:
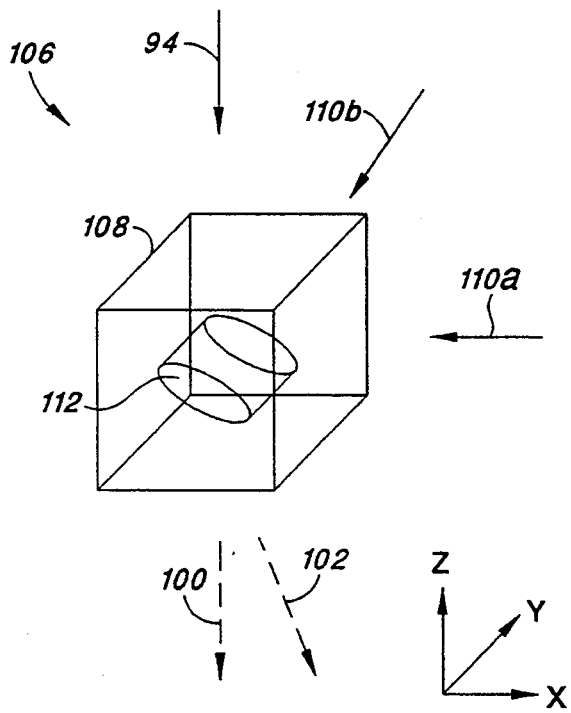
FIG. 1B is a schematic diagram of a lens assembly made from a photoconductor modulated by a light beam having an intensity profile varying in two directions.

Referring next to FIG. 1B, a schematic diagram is illustrated of a lens assembly 106 made from a photoconductor block 108 modulated by one or two light beams 110a and 110b, each having an intensity profile varying in two directions. Light beam 110a propagates in the $-x$ direction and has an intensity profile varying in the y and z directions. Light beam 110b propagates in the $-y$ direction and has an intensity profile varying in the x and z directions. This configuration advantageously provides an "imbedded" volume 112 of higher dielectric constant material within the photoconducting block 108. That is, as explained above, the high frequency radiation beam 110a (which may be, e.g., visible light) has an intensity profile that varies in two directions, perpendicular to its direction of propagation. Such radiation beam "sculpts" a cylindrical region of higher permittivity within the block 108. Advantageously, the second high frequency radiation beam 110b, orthogonal to the first, allows more complex shapes to be created inside the block. In this way, it is possible to create, e.g., IR lenses within the block 108 which can be turned on and off, and/or rotated or translated within the block. Such non-mechanical creation and movement of lenses provides a great deal of flexibility in the design and operation of a beam steering system.

Figure 1C:
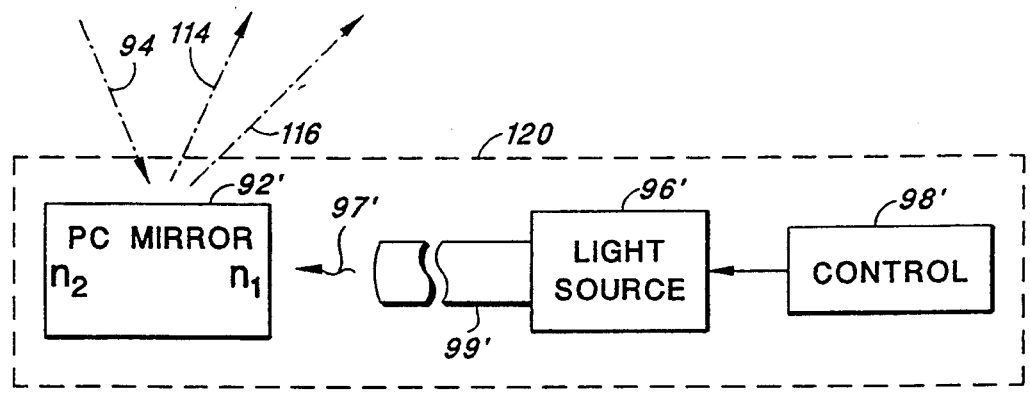
FIG. 1C is a schematic diagram of an optically modulated mirror assembly.

FIG. 1C shows a schematic diagram of an optically modulated mirror assembly 120 that is realized in a manner similar to the lens assembly 90 of FIG. 1A, except that at least a portion of the incident beam 94 of electromagnetic radiation reflects from the block of photoconductor material 92'. Thus, the photoconductor material 92' may be referred to as a photoconductive (PC) mirror 92'. Visible light 97' (or other high frequency radiation, such as infrared light) from a suitable light source 96', such as an LED array, provides a means of modulating the index, n, of the PC mirror 92'. The source of light 96' is controlled by a suitable control circuit 98', and a fiber optical cable 99', or an array of fiber optic cables, may be used as needed and desired to better direct the light 97' to the PC mirror 92'.

The operation of the PC mirror 92' of FIG. 1C is similar to the operation of the PC lens 92 of FIG. 1A. That is, in the absence of a modulating light beam 97', the beam 94' reflects from the surface of the PC mirror 92' in accordance with a first index, thereby traveling along a first beam path, e.g., the path indicated by the dotted line 114. In the presence of a modulating light beam 97', the index of the PC mirror 92' is altered, and the beam 94 reflects from the surface of the PC mirror 92' in accordance with a second index, thereby traveling along a different beam path, e.g., the path indicated by the dotted line 116. Thus, selective control of the modulating beam 97' causes the beam 94 to follow path 114 or 116, thus providing a means of non-mechanically steering the beam 94.

As known to those skilled in the art, reflection from a material, such as the photoconductor block 92', may occur from a layer or plane within the medium (some distance beneath the surface), as well as from the external surface of the medium. As the refractive index of the material affects the passage of the radiation into the medium both before and after such reflection, the refractive index of the material influences the ultimate angle of reflection.

For a plane wave in a vacuum normally incident on a surface of index of refraction n, the reflected intensity ratio R may be expressed by the Fresnel relation:

$$R = (n-1)^2/(n+1)^2. \qquad (7)$$

For most photoconducting materials that will likely be used as the PC mirror 92', e.g., CdS, CdSe, CdTe, HgCdTe, Ge, Si, GaAs, PbS, PbSe, InP, ZnS, ZnSe, (which same materials may also be used as the PC lens 92), the value of R from or near the surface of such materials should vary from 25% to as much as 70%. Therefore, a strong reflected beam or wave will be present. The penetration of the reflected beam into the photoconductor depends on the local free carrier concentration. The amount of penetration is adjustable. This is because there will be a phase shift induced locally over that of an ideal interface, with the magnitude of this phase shift being tunable.

In a preferred embodiment, the phase of the reflected beam is varied laterally by varying the intensity of incident light 97' laterally. As described above, varying the intensity of the incident light 97' modulates the permittivity and hence the refractive index. If desired, the depth dependence to the refractive index can be optimized by introducing internal discontinuities, either by varying the incident light intensity or having highly reflective internal surfaces.

As described above, it is thus seen that one embodiment of the present invention provides an optically modulated photoconductor that may be used as a non-mechanical lens or mirror. Such lens or mirror advantageously provides a non-mechanical mechanism for selectively steering or guiding a beam of electromagnetic radiation that passes therethrough, or reflects therefrom.

The present invention also provides a non-mechanical beam deflector that may be used to form and steer beams of electromagnetic radiation of microwave frequencies and higher (e.g., electromagnetic radiation having wavelengths in the millimeter range). One form of such millimeter wave (MMW) beam deflector is a type of optically controllable Fresnel zone plate that selectively forms and scans an electromagnetic beam across space.

Before describing such MMW beam deflector, it will first be helpful to further review some additional basic principles related to the passage of electromagnetic radiation through a semiconductor or similar material. All materials attenuate the passage of electromagnetic radiation, but to widely varying degrees. If the density of free charge carriers n is small so that the plasma frequency, $$\omega_{plasma} = \sqrt{\frac{ne^2}{m}},$$

is less than the frequency of incident electromagnetic radiation, then the radiation will pass through the material with little attenuation. If, on the otherhand, there are a large enough number of charge carriers so that the plasma frequency is greater than the frequency of the incident radiation then the free charge carriers, i.e., holes or electrons, screen out the passage of electromagnetic radiation with a characteristic decay or attenuation length $\delta$ that is a function of the electrical conductivity $\sigma$, or resistivity $\rho$, of the material and the frequency of the radiation. Such function may be expressed as $$\delta = \frac{1}{2\pi} \sqrt{\rho/f} \qquad (8)$$

where $\delta$ is in cm, $\rho$ is measured in micro-ohm-cm and f is in kHz. In this instance, $\delta$ describes the length over which the electric and magnetic fields of the radiation decrease to 1/e of their incident value. If $\delta$ is much shorter than the thickness of the body, D, then the incident radiation is effectively blocked. In practical terms, this means that metals (conductors) of any thickness effectively attenuate millimeter waves (MMW), semiconductors pass MMW radiation only if not heavily doped, and insulators readily pass MMW radiation.

Photoconductors are semiconducting materials wherein a large increase in electrical conductivity is exhibited when illuminated with light above a minimum frequency. As indicated above, such minimum frequency is referred to as the band gap frequency, and there is a corresponding wavelength that may be referred to as the band gap wavelength. The band gap frequency (or wavelength) depends on the type of material and its doping. With small or negligible doping, for example, some semiconductors show large photoconductivity for light of frequency above the material's band gap frequency. In such instances, the absorbed light creates equal numbers of electrons and holes, both of which cause $\rho$ to increase. For purposes of the present invention, photoconductors are a preferred material because one can control the conductivity, and hence $\delta$, for MMW radiation passing through the photoconductor by simply illuminating the photoconductor with the proper type of high frequency radiation (i.e., radiation having a wavelength that is less than the band gap wavelength). Thus, the attenuation of the microwaves passing through a photoconductor is optically controllable.

In accordance with the present invention, selected parts or pixels (or voxels, where a voxel is a small volume element) of a photoconducting body are illuminated, while other parts, pixels, or voxels are not. By choosing the photoconductive parameters correctly, the MMW radiation passes through the unilluminated areas without serious attenuation, while the MMW radiation is significantly blocked (attenuated) by the illuminated areas.

The three key photoconductive parameters are $\delta_{dark}$, $\delta_{light}$, and D. Other material parameters, such as the intrinsic dielectric constant, also play a role, but it is the three key photoconductive parameters $\delta_{dark}$, $\delta_{light}$, and D that dominate. For example, for passage of MMW radiation through a photoconductive body, it is necessary that $\delta_{dark} >> D$; and for blockage of the MMW radiation by the photoconductive body, it is necessary that $\delta_{light} << D$. When these conditions are satisfied, then the contrast ratio between unilluminated and illuminated regions is large, and it is thus possible to draw a mask pattern analogous to a Fresnel zone plate for MMW radiation on the photoconductor body using light.

Figure 2A:
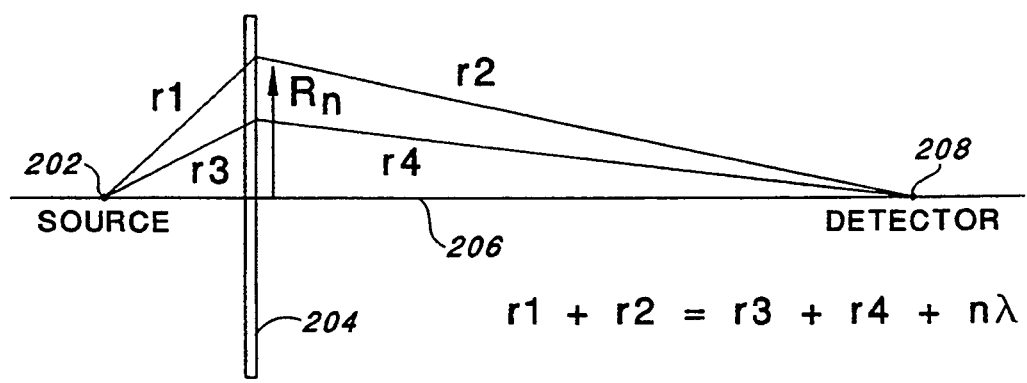
FIG. 2A schematically depicts the conditions for constructive interference between different rays of a beam at a point on axis.

To better understand the operation of a MMW beam deflector made in accordance with the present invention, reference is next made to FIG. 2A where there is shown a schematic representation of the conditions needed for constructive interference to focus different rays of a beam to a point 208 on the axis of symmetry of a symmetric zone plate 204. As seen in FIG. 2A, a point source 202 emits rays of radiation, two of which are shown, along paths r1 and r3. The ray r1 passes through the zone plate 204 at a distance $R_1$ from an axis of symmetry 206. The zone plate 204 may be considered as a lens which takes the ray r1 and redirects it as a ray r2, which ray r2 is detected at the detection point 208 on the axis 206. Similarly, the zone plate 204 receives the ray r3 at a distance r3 from the axis 206, and redirects it as ray r4, which ray r4 is likewise detected at the detection point 208.

The condition for constructive interference at the detection point 208 is that all rays arrive at point 208 after having traveled a path length differing only by an integral number of wavelengths. This condition is met for zones of radii $R_n$ defined by $$R_n = \sqrt{nF\lambda + \left(\frac{n\lambda}{2}\right)^2} \qquad (9)$$

where $\lambda$ is the wavelength of the radiation emitted from the point source 202, F is the focal length of the zone plate 204 and n is an integer.

Figure 2B:
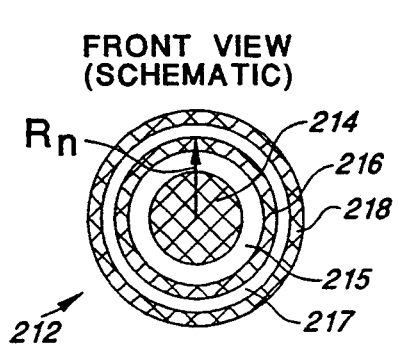
FIGS. 2B and 2C schematically depict front and exploded side views, respectively, of a photoconducting wafer and symmetric optical mask assembly of a millimeter wave (MMW) beam deflector made in accordance with the present invention.
Figure 2C:
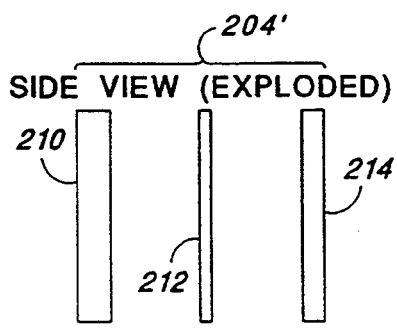

The preferred construction of the zone plate 204 is illustrated in FIGS. 2B and 2C. As seen best in the exploded side view of FIG. 2C, the zone plate is made from a photoconducting wafer 210, an optical mask 212, and a quartz cover 214. As seen best in the front view of FIG. 2B, the optical mask 212 includes concentric regions 214, 216 and 218 (shown with cross hatching) that block visible light, separated by concentric regions 215 and 217 (shown without cross hatching) that do not block visible light. (As used herein, it is to be understood that the term "visible light" includes any appropriate high frequency electromagnetic radiation that is detectable, whether visible or not, e.g., infrared radiation.)

Figure 2D:
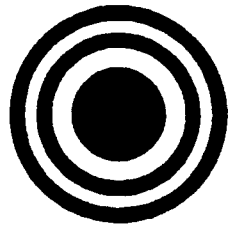
FIGS. 2D and 2E illustrate alternative symmetric optical masks that may be used to induce a zone plate in a photoconducting wafer in accordance with the present invention.
Figure 2E:

Representative masks 212 that are designed for use with MMW radiation having a frequency of 94 GHz ($\lambda = 0.32$ cm), and a focal length R of 2.54 cm, are shown drawn to scale in FIGS. 2D and 2E. The optical mask shown in FIG. 2D has a center that is opaque to high frequency radiation, e.g., visible light, while the mask shown in FIG. 2E has a center that is transparent to high frequency radiation. It is noted that the entire mask is transparent to MMW radiation. However, when high frequency electromagnetic radiation, e.g., visible light, is present, the unmasked portions of the photoconductor wafer 210 become conductive, thereby attenuating MMW radiation; while the masked portions of the wafer 210 do not become conductive, thereby not attenuating MMW radiation. Thus, by selectively applying visible light or equivalent radiation to the zone plate 204, it is possible to selectively block MMW radiation passing through the wafer 210 in accordance with the pattern on the mask 212. By selecting a pattern on the mask 212 that creates the conditions for constructive interference at the focal point 208, it is thus possible to selectively cause constructive interference at the point 208 by optically modulating the zone plate 204.

The photoconductor wafer 210 may be made from a wide variety of doped photoconducting materials, including silicon (Si), with many different doping levels and dopants; germanium (Ge); gallium arsenide (GaAs), and cadmium sulfide (CdS). In the experimental results presented below, Si wafers were used with MMW radiation at 94 GHz.

Figure 3:
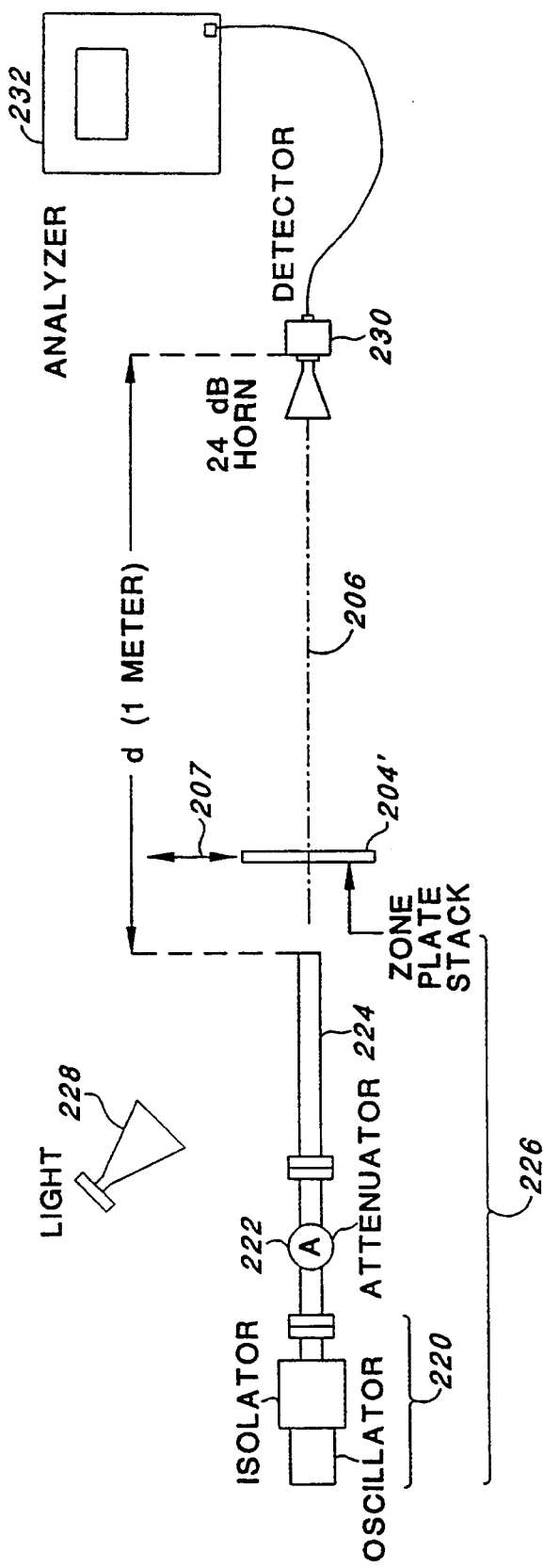
FIG. 3 is a block diagram of test apparatus used to gather the data shown in FIGS. 4–10 and 13–16.

To demonstrate the attenuation of MMW radiation that is achieved using a beam deflector as described above in FIGS. 2A–2E, a test configuration as shown in FIG. 3 was employed. As seen in FIG. 3, a microwave source 220 generated MMW radiation at 94 GHz. The intensity of the MMW radiation was controlled by an attenuator 222, and directed through conventional section of waveguide 224 to an optically modulated zone plate 204'. Collectively, the microwave source 220, attenuator 222, and waveguide 224 may be referred to as a MMW radiator 226. While there are numerous devices commercially available that may be used to realize the MMW radiator 226, the commercial devices used were Hughes model 47246H-8603 oscillator, a Hughes model 45736H-1200 attenuator, and an Alpha W690, 10" waveguide section (modified).

The zone plate 204' was made from three inch diameter silicon wafers as described above in FIGS. 2A–2E. At an appropriate distance d from the radiator 226, aligned with the central axis 206 of the radiator 226, a detector 230 was positioned, coupled to an analyzer 232. The detector was mounted for lateral movement as required in order to detect the beam intensity as a function of off axis position, thereby allowing beam width to be measured. While numerous commercially available devices could be used as the detector 230 and analyzer 232, the actual devices used were Pacific Millimeter Products model WD detector, and a Wilton model 560A analyzer.

A broad band light source 228 was used to selectively illuminate the zone plate 204'. Several light sources and light configurations may be used. It is important that the light source 228 have a frequency greater than the band gap frequency and have sufficient intensity so as to produce a photon energy at the silicon wafer of the zone plate 204' that is greater than the band gap energy of silicon, 1.11 eV. (Note that the band gap energy is inversely proportional to the band gap frequency.)

Although not shown in the diagram of FIG. 3, it is noted that the zone plate 204' was mounted in a hole of the same size in a metal plate. Radar absorbing materials covered much of the plate. This was done to ensure that, for purposes of the configuration shown in FIG. 3, only MMW radiation passing through the zone plate 204' was allowed to reach the detector 230.

Figure 4:
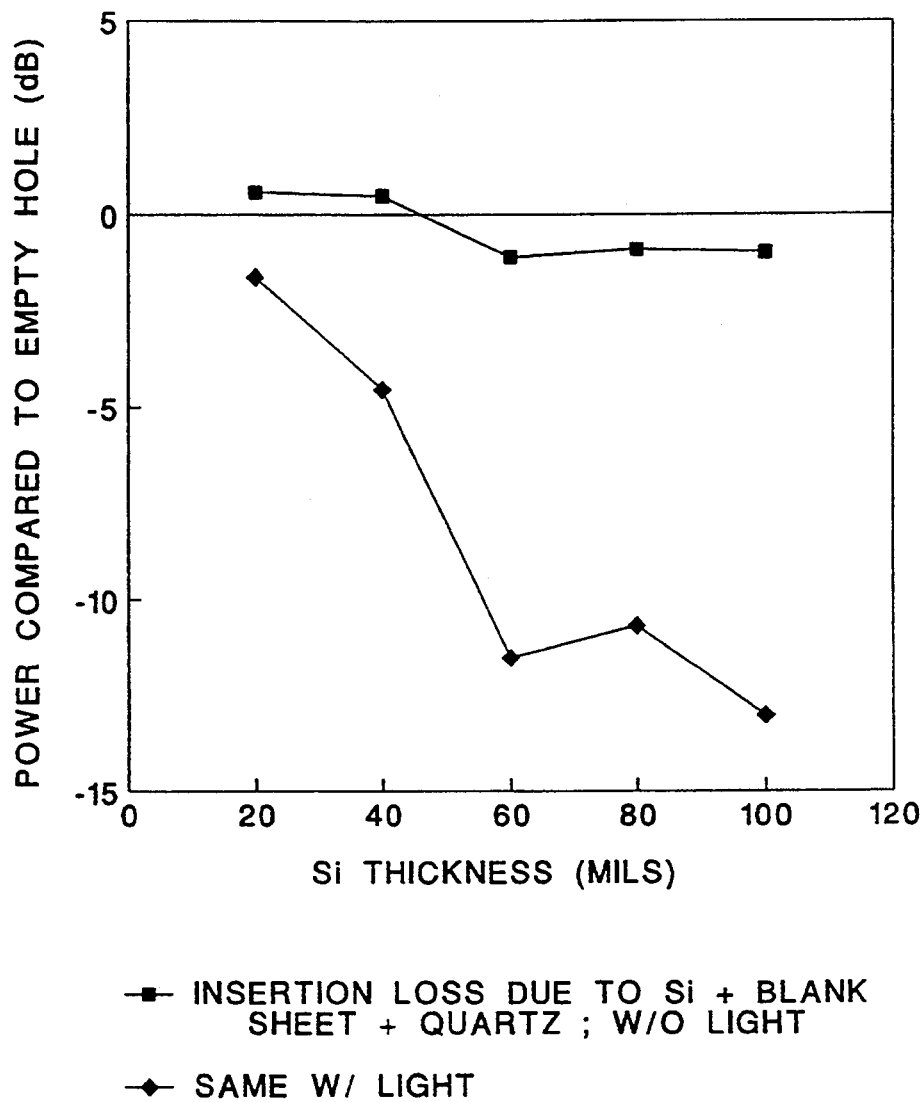
FIGS. 4–10 illustrate various graphs depicting data obtained using the apparatus of FIG. 3.

Using the configuration shown in FIG. 3, test data was obtained as depicted in FIGS. 4–10. FIG. 4 shows the amount of detected MMW power at a distance d of about 1 meter from the radiator 226 with and without light illuminating the zone plate 204'. The radiator 226 was positioned approximately 2.5 cm behind the plate 204'. For the data shown in FIG. 4, the mask 212 of the zone plate 204' was made from a transparent plastic sheet (from which optical masks are made), i.e., no selective masking occurred. As seen in FIG. 4, in the unilluminated state (i.e., with the light source 228 off), the transmitted power was attenuated only about 1 dB. This shows that the insertion loss through the zone plate 204' is negligible. As further seen in FIG. 4, however, in the illuminated state (i.e., with the light source 228 on), the transmitted power was attenuated by as much as 13 dB, or to approximately 5% of its dark value. This data thus show that MMW radiation can be effectively attenuated through selective optical modulation.

Figure 5:
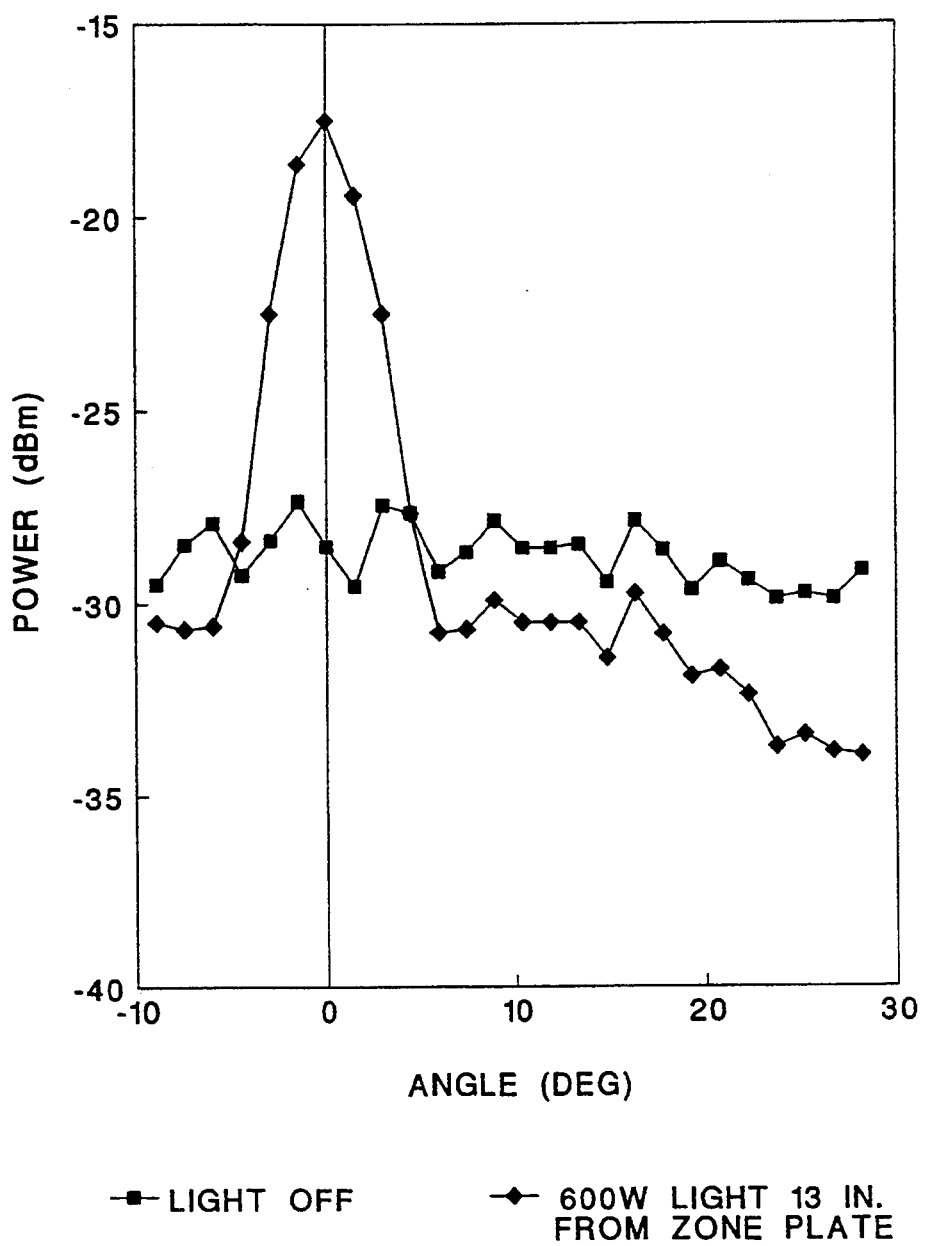
Figure 6:
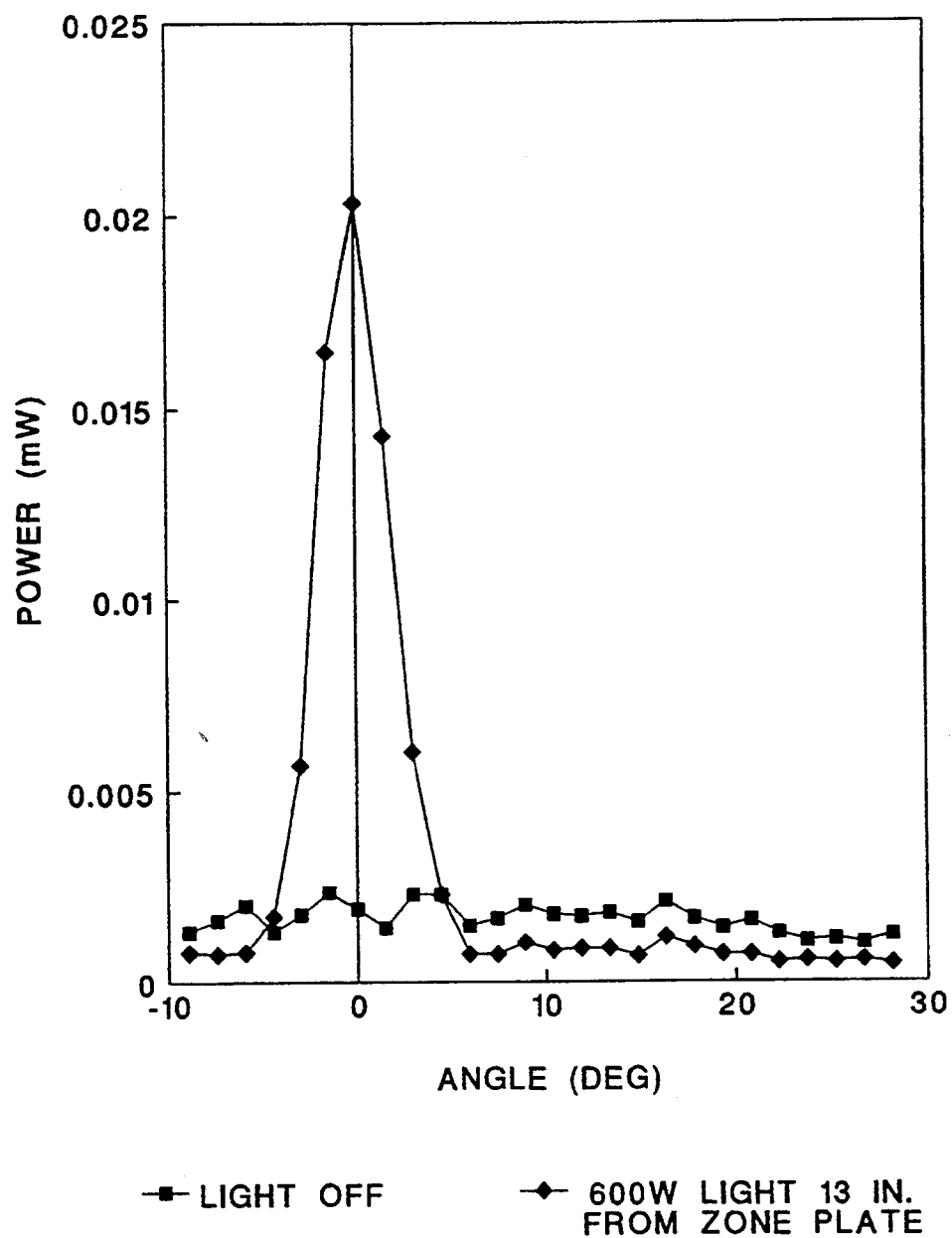

Still using the configuration shown in FIG. 3, with a 600 W halogen lamp being used as the light source 228, and with a mask as shown in FIG. 2D being used as the mask 212, and with a three inch diameter Si wafer having a thickness of 80 mils being used as the wafer 210, the data shown in FIGS. 5 and 6 were obtained. The data obtained indicated that the unilluminated assembly —wafer+sheet+quartz— had only about 1 dB attenuation of MMW at 94 GHz. See the "diamond" data points, ◆, and associated curves in FIGS. 5 and 6. The illuminated assembly, on the other hand, caused a narrow beam to be formed having a power gain of about 10 dB! See the "square" data points, ■, and associated curve in FIGS. 5 and 6. Note that the same data is presented in FIG. 5 as in FIG. 6, except that the data are plotted with a linear power scale in FIG. 6. The results of FIGS. 5 and 6 thus clearly demonstrate the beam forming capability of the invention.

Figure 7:
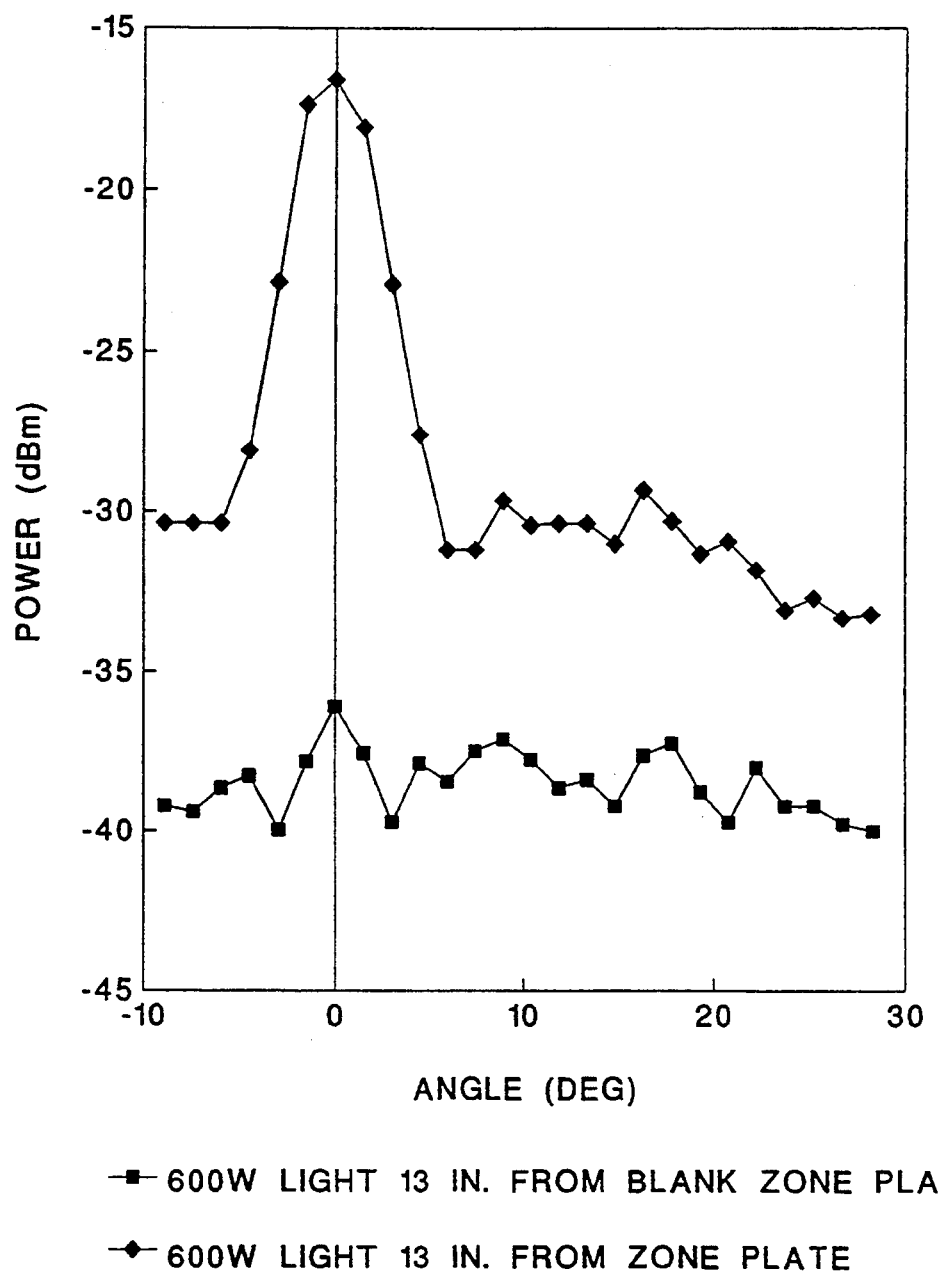
Figure 8:
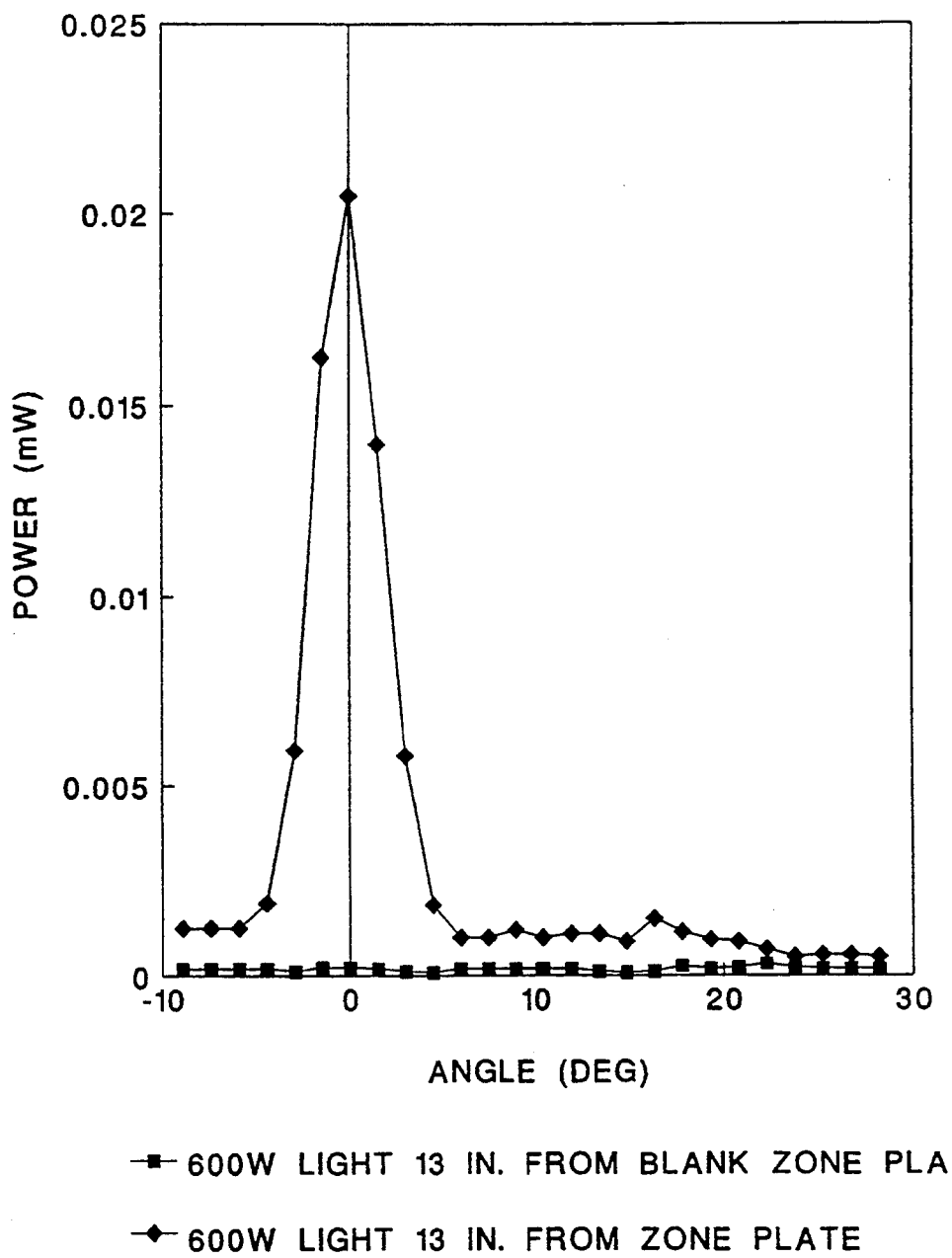
Figure 9:
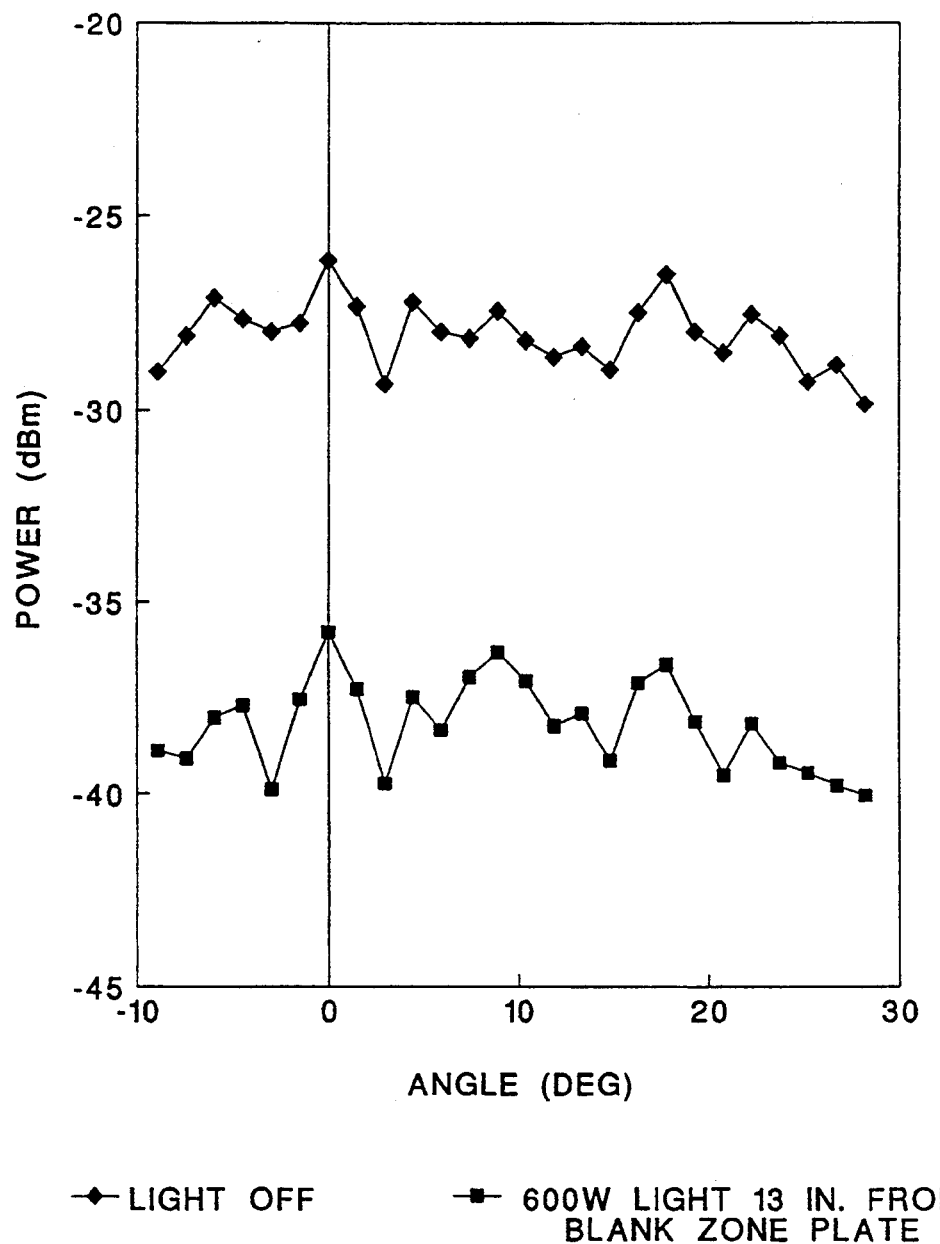

To further demonstrate the beam forming capability of the invention, the zone plate 204' used in obtaining the data of FIGS. 5 and 6 was modified by replacing its mask 212, containing a mask pattern as shown in FIG. 2D, with a blank transparency (made from the same sheet of material as the mask 212). Everything else was the same, e.g., light intensity, spacing, location of plate 204', etc. The data obtained using such a "blank mask" plate is shown as the "diamond" data points, ◆, and associated curves in FIGS. 7 and 8. (Note, FIG. 8 is the same as FIG. 7 except that the data are plotted with a linear power scale.) Included for comparison purposes in FIGS. 7 and 8 are the data obtained using the mask 212 made as shown in FIG. 2D. See the "square" data points, ■, and associated curves. That is, the "square" data points and associated curve of FIG. 5 are the same as FIG. 7; and the "square" data points and associated curve of FIG. 6 are the same as FIG. 8. As these data clearly show, there is a gain of more than 20 dB when the mask 212 is used to provide the desired constructive interference at the detection point. Such results are significant because they show that one operational mode for an illuminated zone plate (beam scanner) made in accordance with the present invention is not to use an optical mask, but instead to employ a configurable light array that is switched from uniform illumination to non-uniform illumination in order to turn a beam on and off. Further, as indicated below, the shape of the illuminated zone plate profile can be selectively changed in order to scan the beam in different directions in space.

Figure 10:
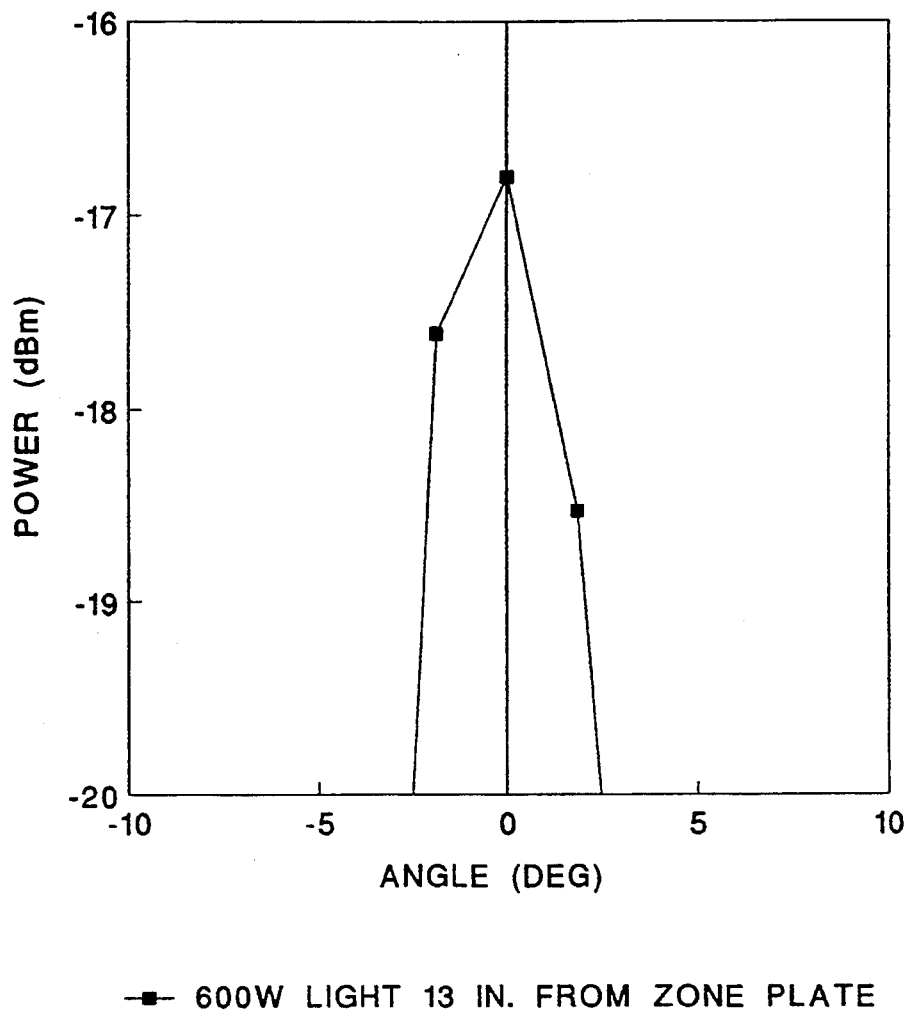

Referring next to FIG. 10, data are shown for the beam as formed as in FIGS. 5-8 but with an expanded scale. If the width of the beam is defined as the 3 dB points, FIG. 10 illustrates that the width of the beam extends from about ±2.5°. Part of this width is instrumental in nature due to the detector horn 230 that is used. A beam of narrower intrinsic width is readily obtainable with a modified zone plate configuration, as is reduced power density outside the beam. The outside diameter of the zone plate limits the minimum beam width by diffraction effects. Making the zone plate larger in diameter thus produces narrower beams. It is also noted that, although the data presented in FIGS. 5-8 and 10 show beam width in a horizontal plane, the beam width obtained in a vertical plane is substantially the same as that obtained in the horizontal plane.

It is further noted that the data shown in FIGS. 4-10 were taken using a Si wafer having a thickness of 80 mils. Data from Si wafers of other thicknesses, i.e., 20, 40, 60 and 100 mils, was also tested. It was found that the 20 mil thickness did not produce a well formed beam due to insufficient attenuation under illumination. However, the other thicknesses gave well-formed beams. Thus, it is seen that Si wafer thickness greater than about 40 mils may be used as the photoconductive wafer of an optically modulated zone plate (beam deflector) made in accordance with the present invention.

Figure 11A:
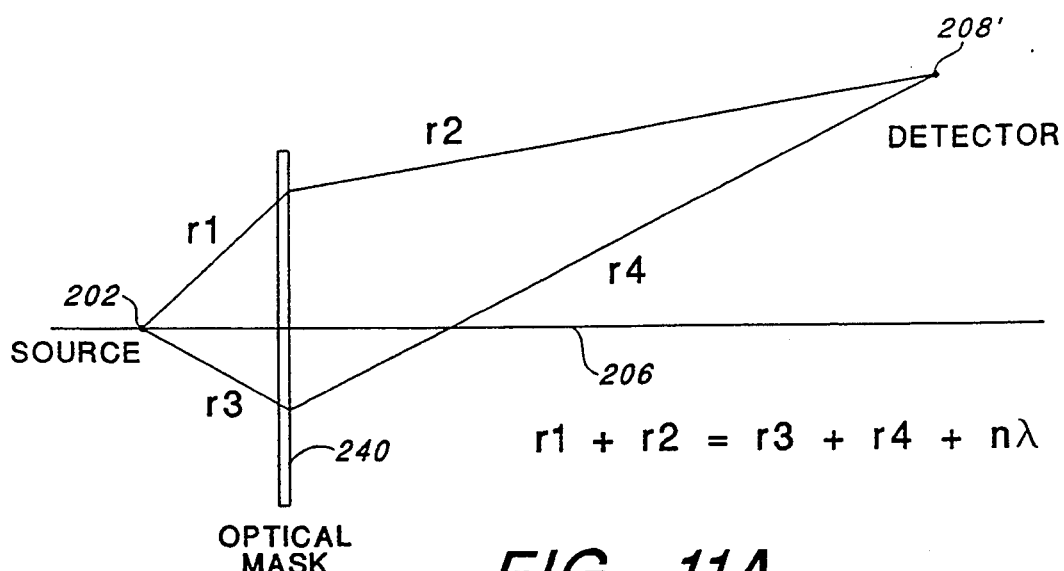
FIG. 11A schematically depicts the conditions for constructive interference between different rays at a point off axis, and thus shows how scanning is achieved.
Figure 11B:
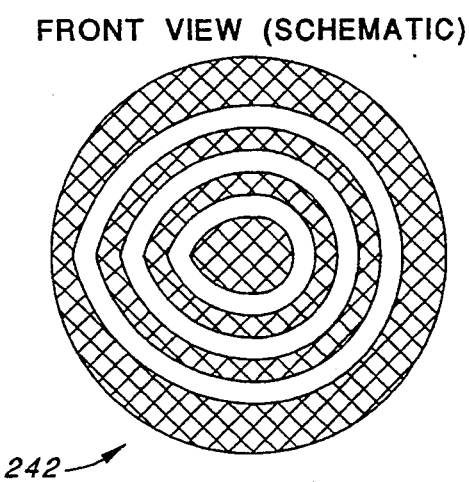
FIGS. 11B and 11C schematically depict front and exploded side views, respectively, of a photoconducting wafer and asymmetric optical mask assembly of a MMW beam deflector made in accordance with the present invention.
Figure 11C:
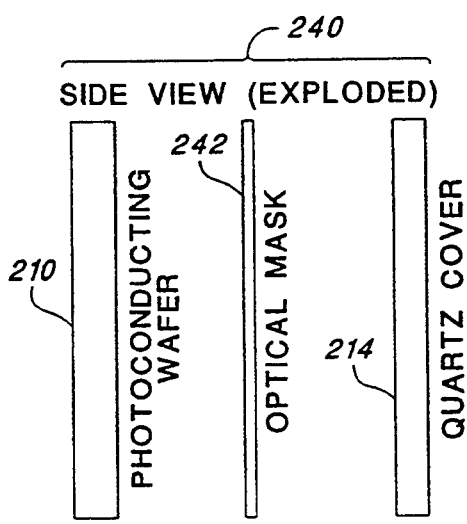

As described above, it is thus seen that a MMW beam can be formed by appropriately illuminating selective portions of a semiconductor body of a zone plate assembly in order to create constructive interference at a focal point of the zone plate assembly. In order to steer a beam formed in this manner, the zone plate assembly may be moved off-axis, e.g., as shown by the arrow 207 in FIG. 3. As the zone plate moves, the formed beam also moves, or is steered, by the plate movement. Disadvantageously, however, the resulting system exhibits astigmatism. However, such astigmatism may be removed by making the mask of the zone plate appropriately asymmetric, as shown in FIGS. 11A–11C. Note that FIGS. 11A–11C are substantially the same as FIGS. 2A–2C, respectively. Accordingly, substantially the same explanation and description as was given above relative to FIGS. 2A–2C also applies to FIGS. 11A–11C, and the same reference numerals are used to describe like parts.

Figure 12:
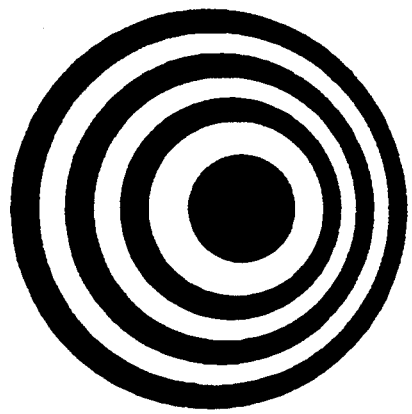
FIG. 12 depicts an asymmetric optical mask that may be used to induce a zone plate that creates a beam 20° off axis.
Figure 13:
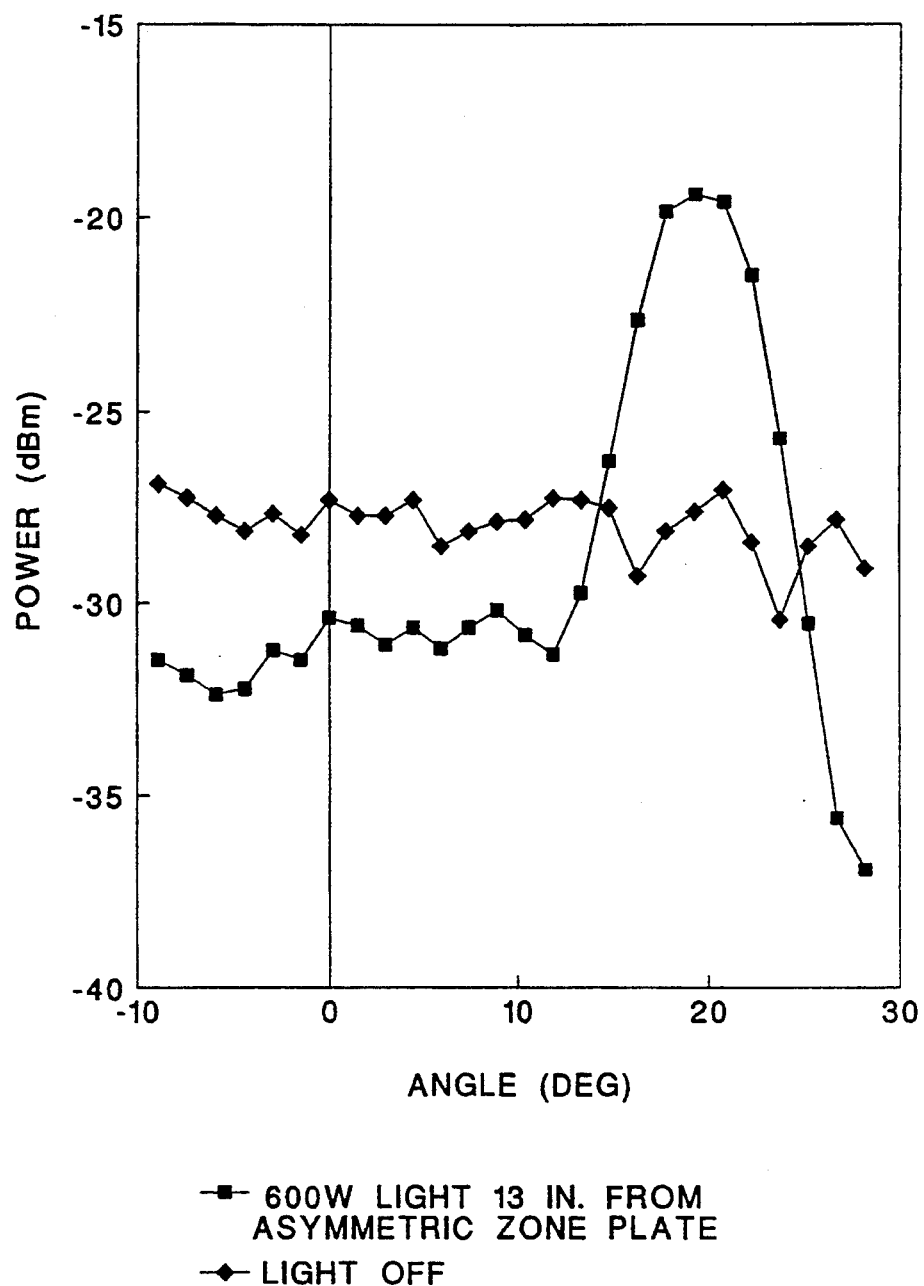
FIGS. 13–16 show various graphs of data obtained using asymmetric optical masks as shown in FIGS. 11A–12.

The main difference, between FIGS. 2A–2C and FIGS. 11A–11C is that FIGS. 11A–11C show the use of an asymmetric zone plate mask 242 with a Si wafer 210 and quartz cover 214 in order to form a zone plate assembly 240 that may be used to steer a formed beam off of the axis 206. The astigmatism of the mask 242 is best seen in the front view of the mask shown in FIG. 11B, whereas the makeup of the zone plate assembly 240 is best seen in the exploded side view of FIG. 11C. FIG. 11A shows the manner in which the beam is focused at an off-axis detection point 208'. FIG. 12 shows the actual pattern used on an asymmetric mask 242 made for a three inch diameter Si wafer and for operation at 94 GHz at a focal length of 2.54 cm. The doping of the Si wafer was $10^{14}$ dopant atoms/cm$^3$ or less.

Figure 14:
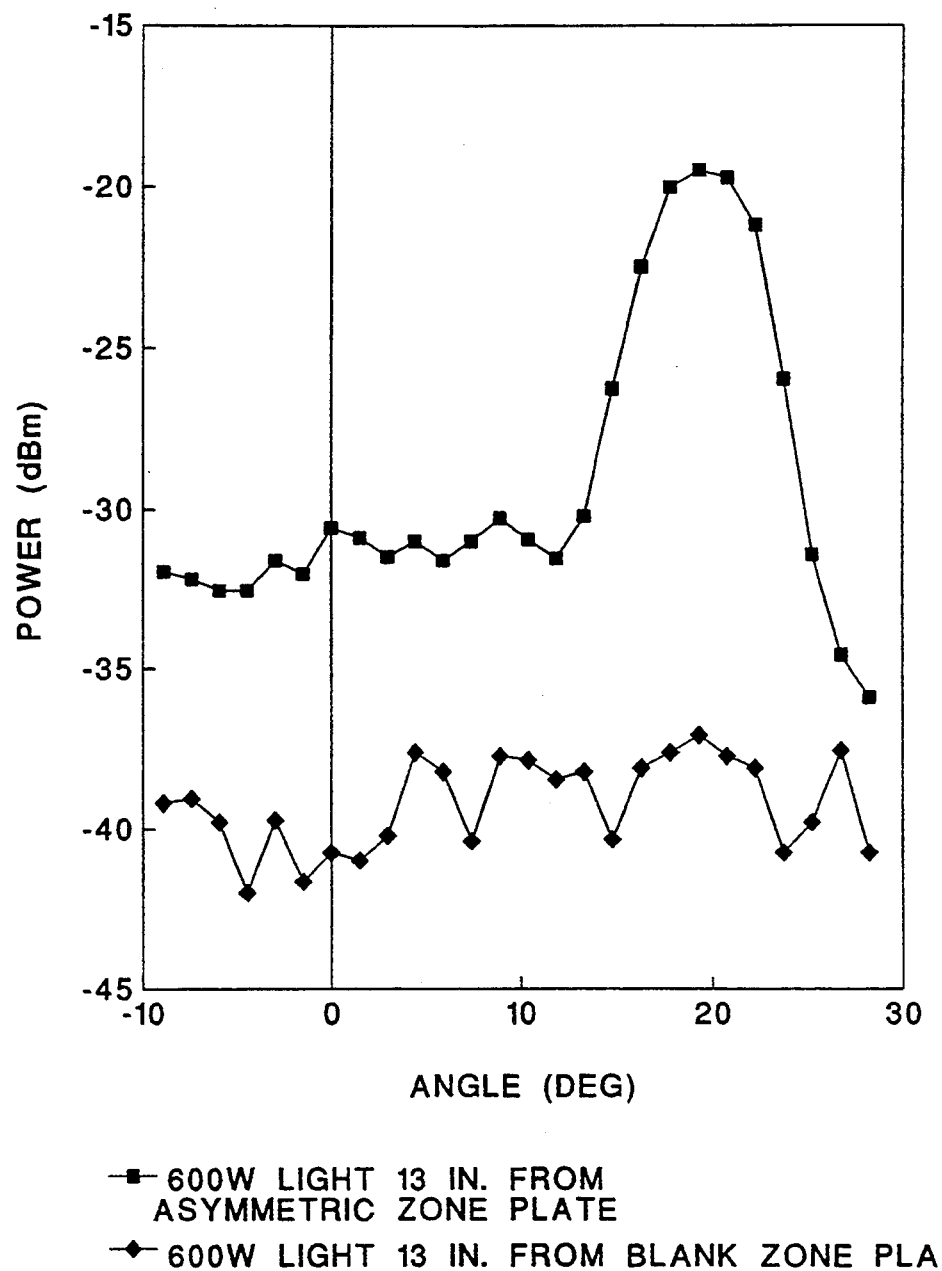
Figure 15:
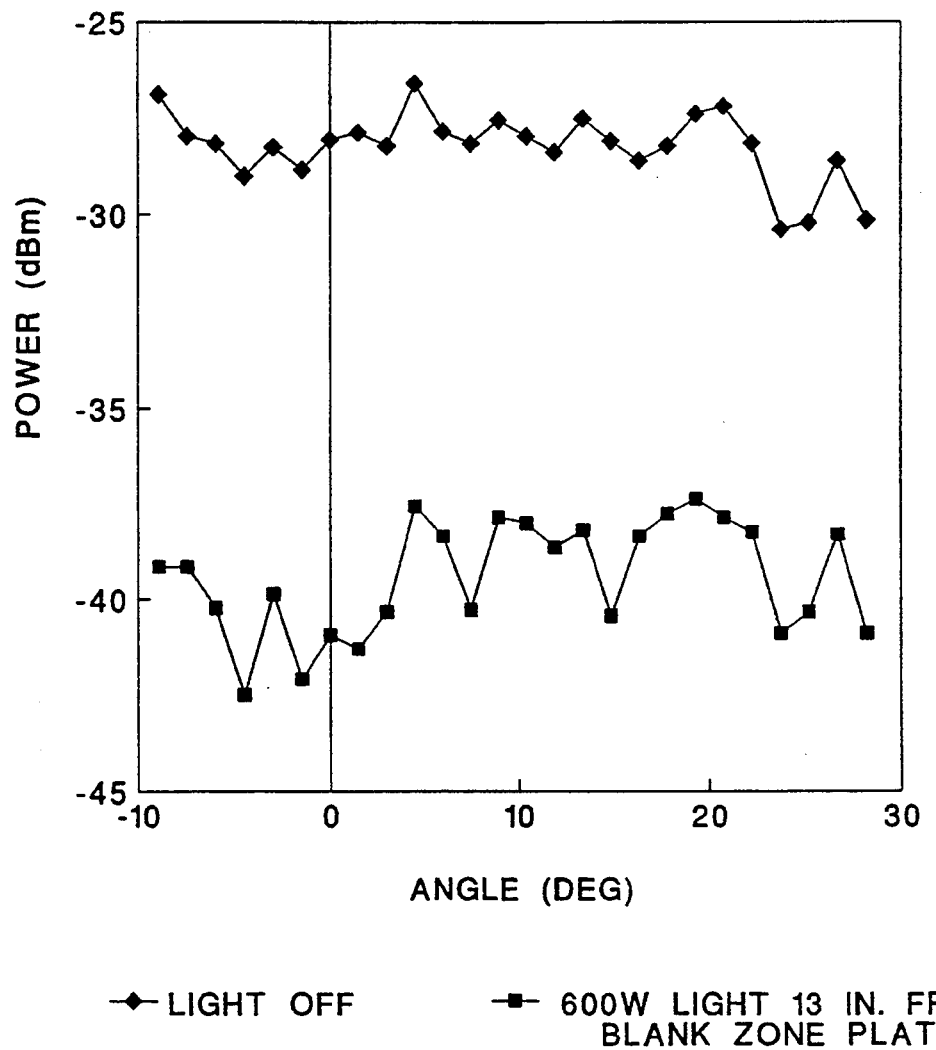
Figure 16:
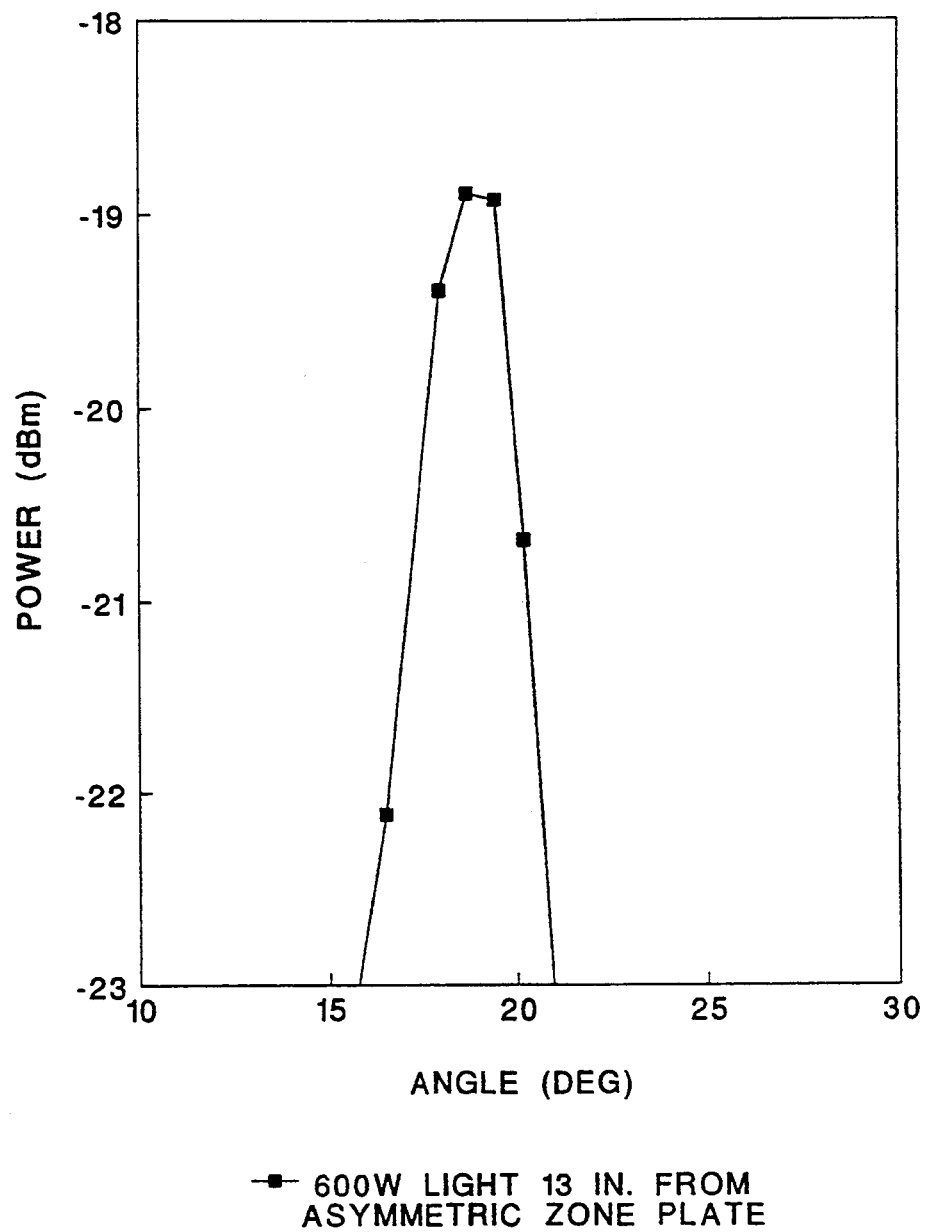

Data obtained using the asymmetric zone plate assembly 240 are illustrated in FIGS. 13-16. To collect the data of FIGS. 13-16, the 80 mil Si wafer was used. Otherwise, the apparatus and test configuration were identical to that described above in connection with FIGS. 3-10. The data in FIGS. 13-16 is believed to be self-explanatory, particularly when compared to the data and description presented above in connection with FIGS. 4-10. Note that FIG. 13 parallels FIG. 5; FIG. 14 parallels FIG. 7; FIG. 15 parallels FIG. 9; and FIG. 16 parallels FIG. 10. The data of FIGS. 13-16 clearly demonstrate that by changing the illumination pattern on the wafer 210, a beam can be formed and scanned in different directions. Moreover, the data of these figures indicates that a beam can be formed and scanned over an angle of at least 20°. Larger scanning angles in all directions may also be achieved.

Advantageously, the beam that is formed and scanned using the beam deflection apparatus of the present invention may be scanned across space at high rates. This capability allows MMW beams thus formed to be used, e.g., in radar applications. A typical radar application may require the MMW beam to be scanned across space at a rate greater than, e.g., $10^3$ beams per second.

Figure 17:
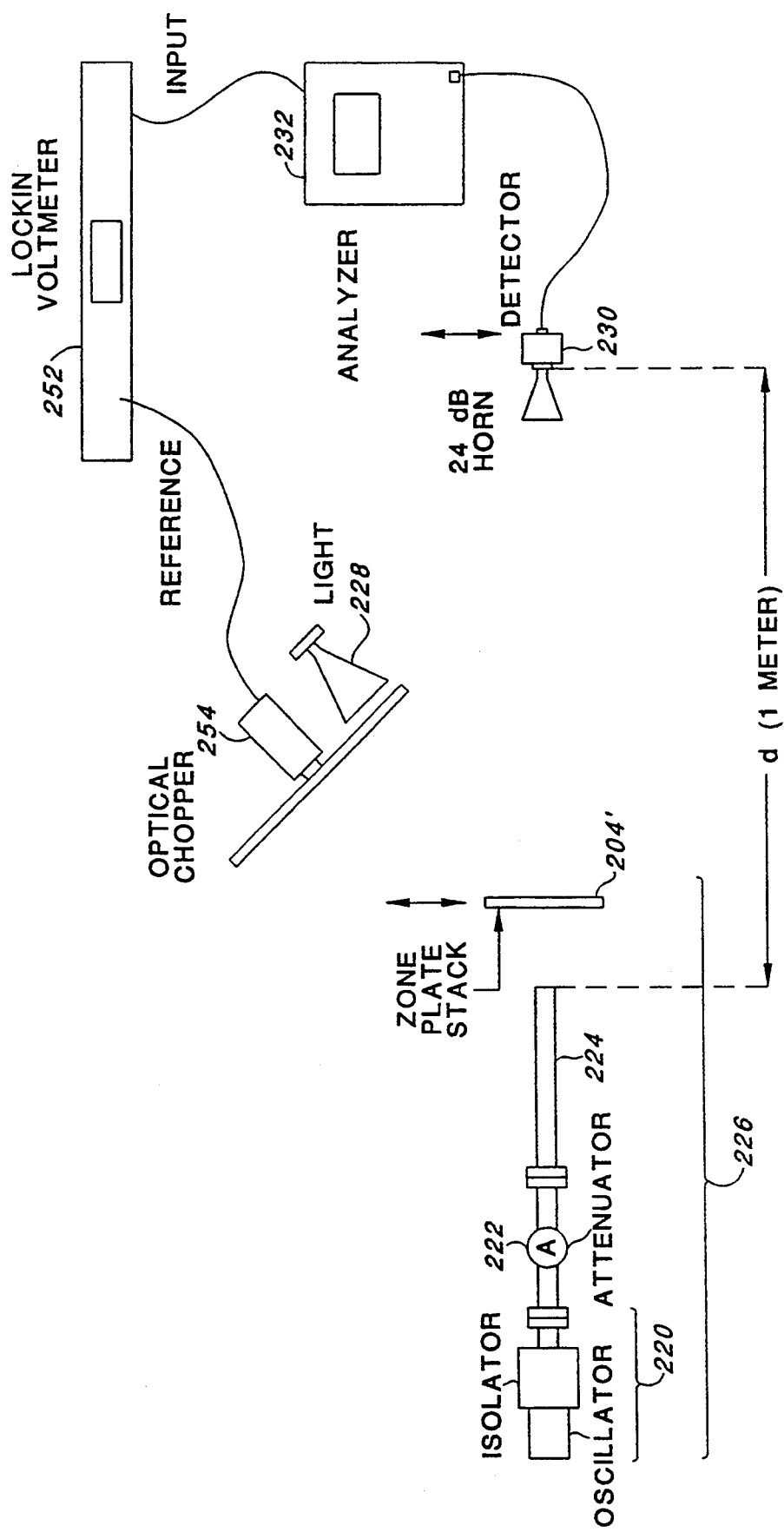
FIG. 17 is a block diagram of apparatus used to measure the frequency dependence of beam deflecting apparatus made in accordance with the present invention.

To demonstrate the scanning rate capability of apparatus made as described and shown in FIGS. 4-16, a test configuration as shown in the block diagram of FIG. 17 was implemented. The MMW radiator 226, the light source 226, the detector 230, and the analyzer 232 shown in FIG. 17 were the same as used in the test configuration of FIG. 3. The zone plate assembly used with the test configuration of FIG. 17 was the symmetric zone plate 204'; although the asymmetric zone plate assembly 240 could just as easily have been used. The primary difference between the test configuration shown in FIG. 17 was the use of a mechanical chopper 254. The chopper 254 was used to chop the light from the light source 228 that illuminated the zone plate 204'. A locking voltmeter 252, coupled to the analyzer 232, was also used. Such voltmeter 252 is a phase sensitive ac voltmeter having a substantially flat frequency response up to 100 KHz. It was used to monitor the output of the analyzer 232 and to function as a amplifier for the detector signal. A reference frequency for the locking was established by the optical chopper in conventional manner. The voltmeter 252 may be Model 5210 made by Princeton Applied Research.

Figure 18:
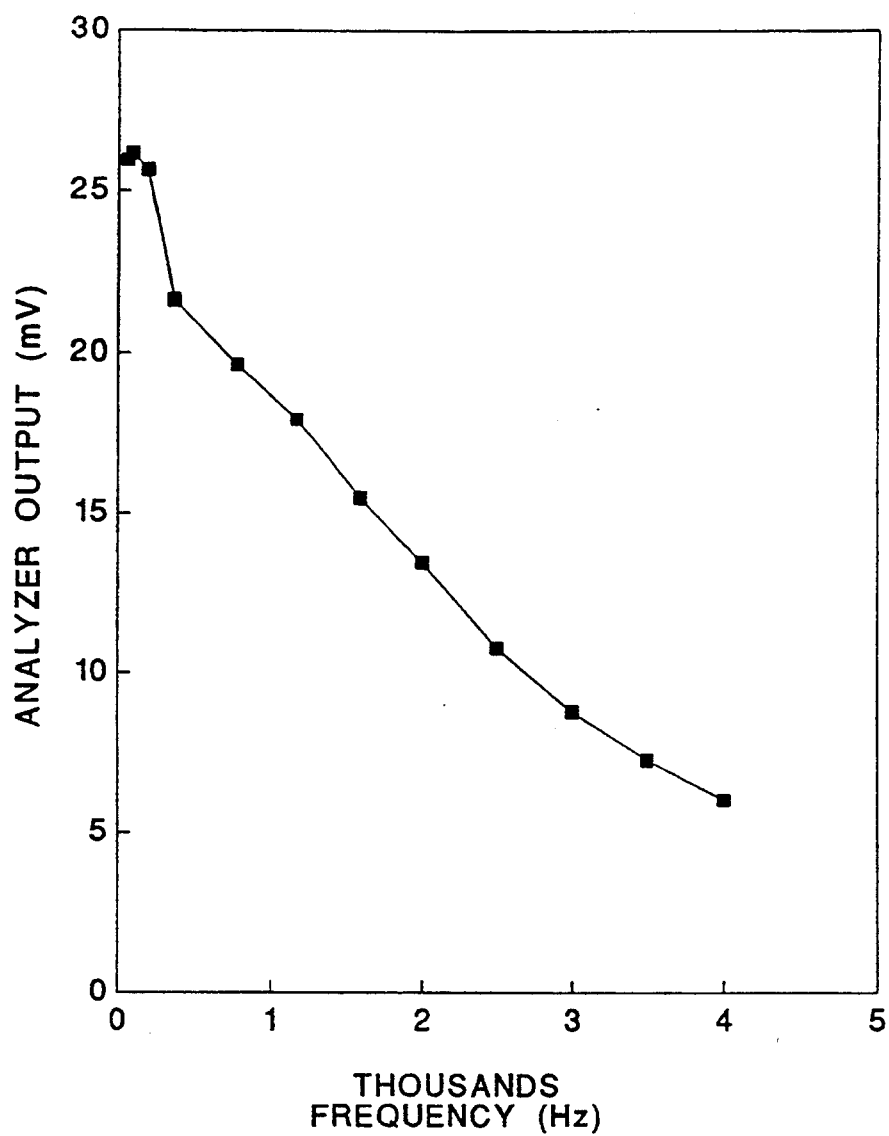
FIGS. 18–20 are graphs showing various data obtained using the apparatus of FIG. 17.
Figure 19:
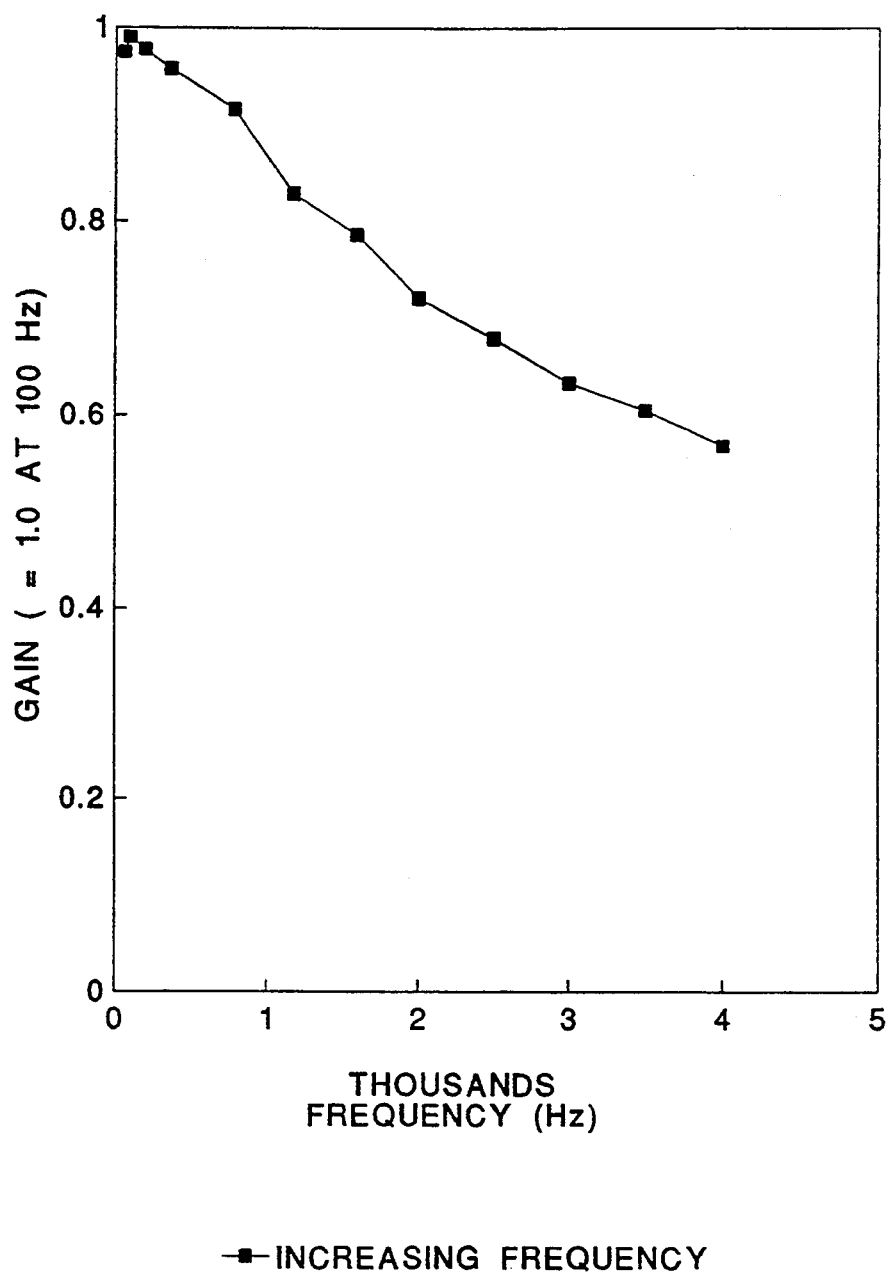
Figure 20:
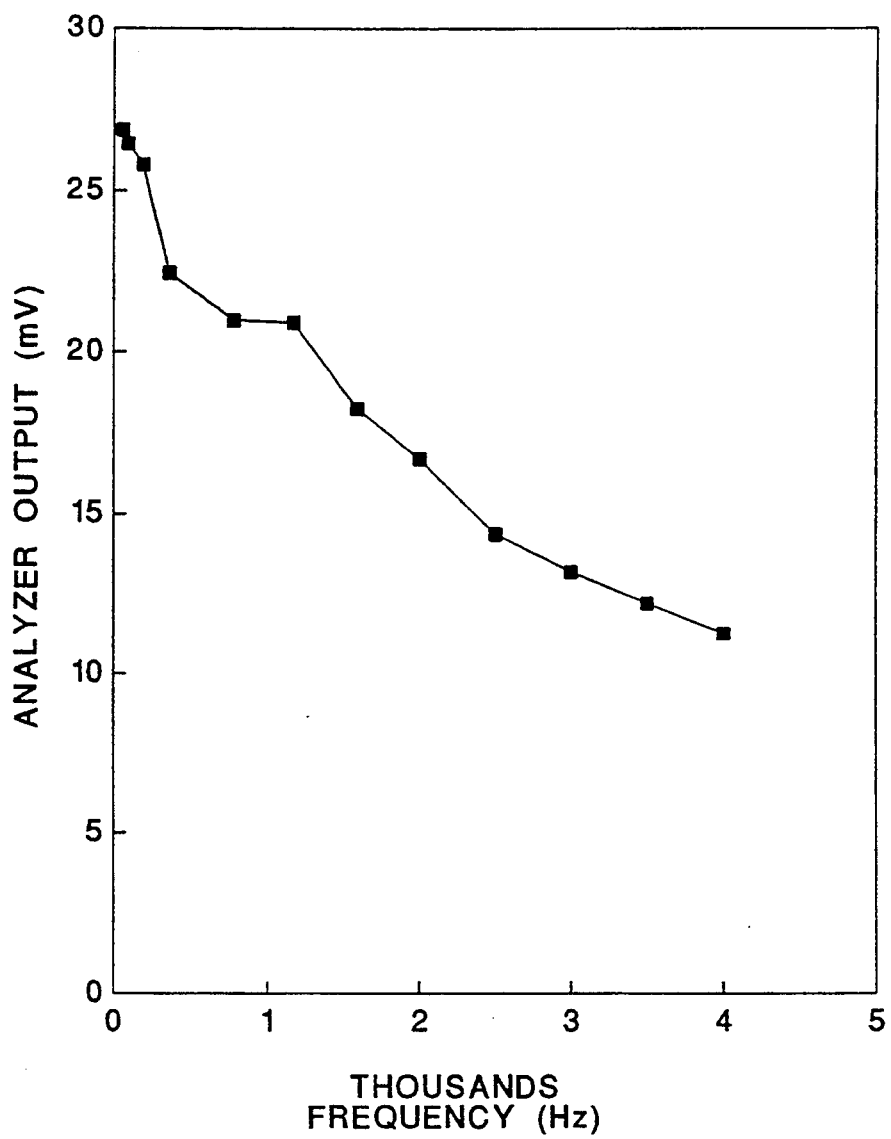

Data was taken using the configuration shown in FIG. 17 by starting the chopper 254 at a low frequency and measuring the analyzer output point by point as the frequency as increased from 8 Hz to about 4 KHz. The raw measured data are shown in FIG. 18. The drop off with frequency is at least partially instrumental. To measure the gain of the apparatus as a function of frequency, the light was removed and the chopper positioned between the wafer and detector so that it chopped the MMW beam. The ac component of the analyzer was then measured as a function of frequency as before. These measured data are shown in FIG. 19. Such data then serve to establish the gain of the apparatus as a function of frequency, which data is then used to provide a basis for a frequency correction. The corrected measurements are shown in FIG. 20. A comparison of FIG. 20 with FIG. 18 shows that about 50% of the high frequency fall off has been removed.

Thus the data collected as described above in connection with FIGS. 3-20 demonstrate the effectiveness of the present invention, i.e., demonstrate that a diffractive lens (zone plate assembly) for MMW radiation can be produced by spatially varying the distribution of charge carriers in a photoconducting or semiconducting body. Such diffractive lens assembly advantageously forms a beam of MMW radiation, which beam can be selectively steered to different directions in space by changing the configuration of the induced carriers. It is also seen from the above data that the response of the diffractive lens is rapid enough to change the beam direction many times a second, thereby making the lens assembly well suited for MMW beam steering applications requiring a fast scanning rate, e.g., radar systems.

Figure 21A:
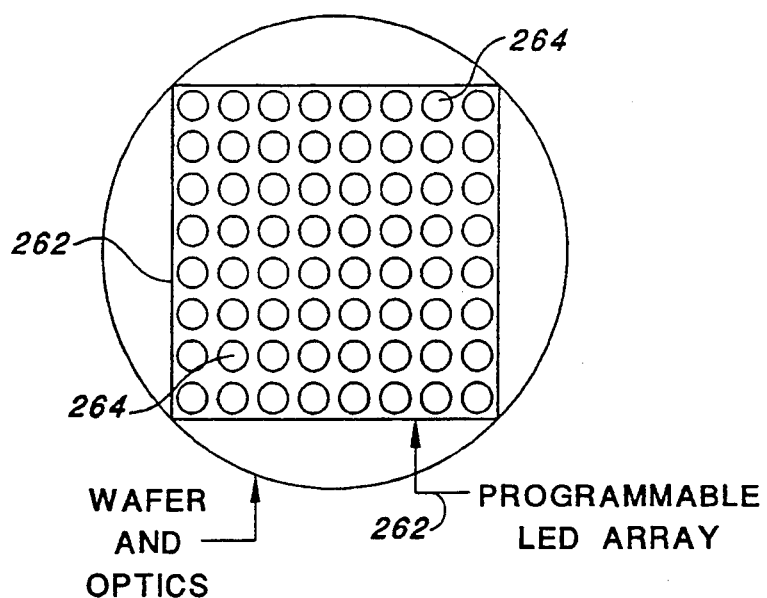
FIGS. 21A and 21B are front and side views, respectively, of an alternative embodiment of a beam deflector made in accordance with the present invention, showing the use of a two-dimensional programmed array of light sources for selectively illuminating a desired spatial light pattern in a semiconductor body so as to form a diffractive lens that programmably controls the direction of a beam passing through such lens.
Figure 21B:
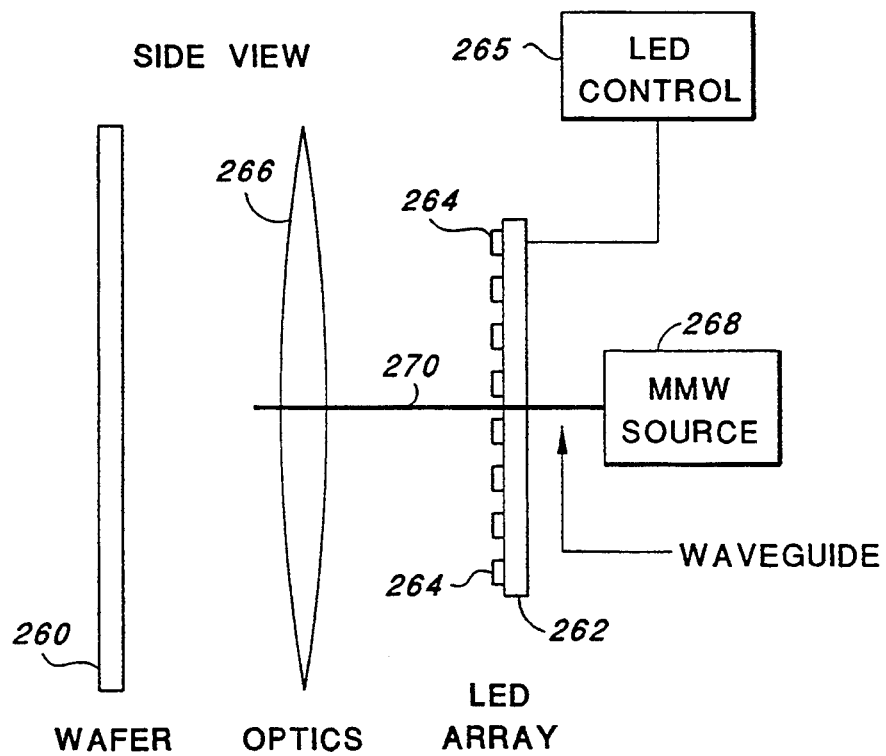

In addition to the embodiment described above, wherein an optical mask 212 or 242 is used with a uniform source of light in order to produce the desired pattern of light within the photoconductive wafer 210, other embodiments of the invention may also be used. Any technique or configuration that produces a desired light pattern in the semiconductor wafer or body (which light pattern, in turn, causes the desired spatial distribution of charge carriers within the semiconductive body) may be used. For example, as shown in FIGS. 21A and 21B, an array 262 of small radiative sources 264, e.g., light emitting diodes (LED's), or other small sources of light or high frequency radiation (having a wavelength much less than the wavelength of the MMW radiation), is controlled so that each radiative source, e.g., each LED, of the array 262 can be individually turned ON or OFF as programmed. FIG. 21A is a front view, and FIG. 21B is a side view of such array 262. As seen best in FIG. 21B, the array 262 is positioned so that the light from each LED 264 is directed to a photoconducting wafer 260, e.g., a Si wafer, through appropriate imaging optics 266. The imaging optics 266 may include an optical fiber, or bundle of optical fibers. The individual radiative sources 264 are controlled by an appropriate control circuit 265, e.g., by causing a current to flow through a designated LED, so as to selectively emit illuminating radiation in accordance with a desired pattern. Thus, by selectively controlling the particular LED's 264 that are turned ON, selected portions, or pixel areas, of the wafer 260 are illuminated through the imaging optics 266. Hence, MMW radiation that is generated by a MMW source 268 and directed to the wafer 260 through a suitable waveguide 270 is selectively blocked by the conductive (illuminated) pixel areas of wafer 260.

Figure 22A:
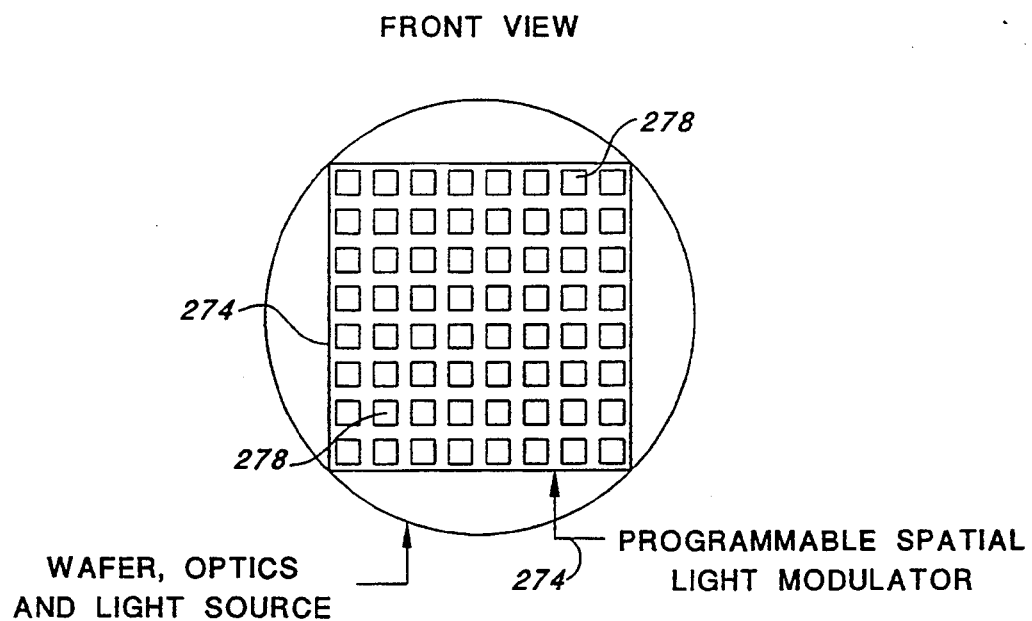
FIGS. 22A and 22B are front and side views, respectively, of a further alternative embodiment of a beam deflector, showing the use of a two-dimensional light modulator that modulates light from a uniform light source, with the light from such light modulator selectively illuminating a desired spatial light pattern in a semiconductor body so as to form a diffractive lens that controls the direction of a beam passing through such lens in a desired manner.
Figure 22B:
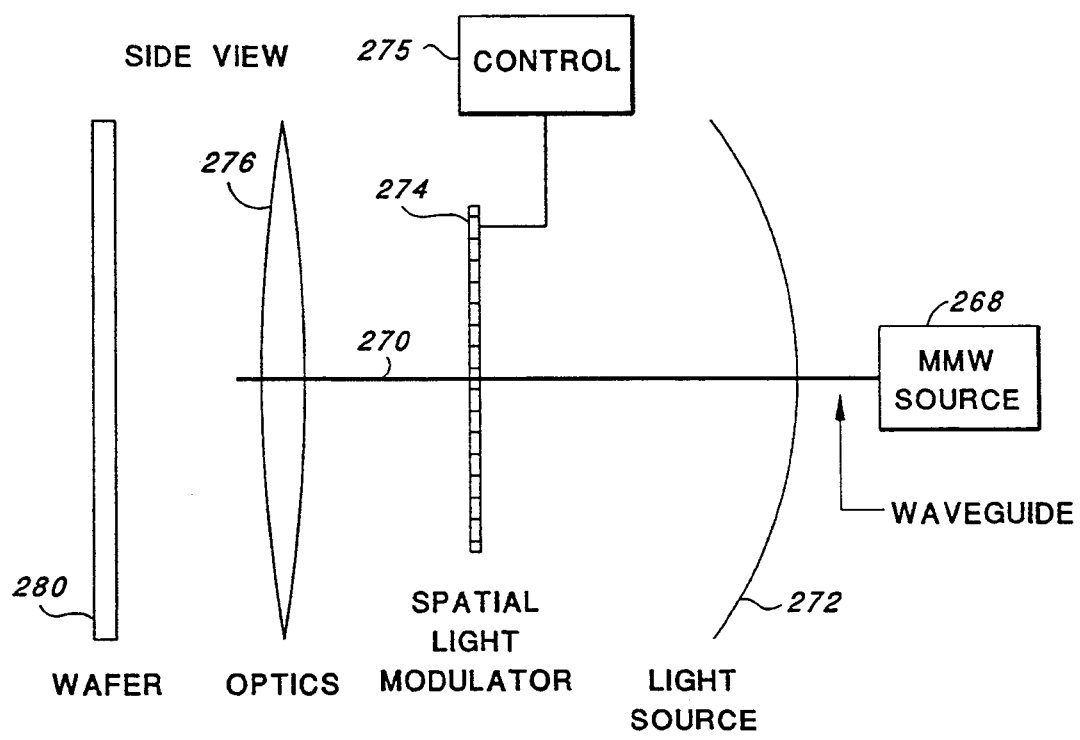

Another embodiment of the invention, shown in FIGS. 22A and 22B, uses a uniform radiative source 272, e.g., a source of visible light having a wavelength much less than the wavelength of the MMW radiation, that selectively illuminates a semiconductor body, i.e., a photoconductive wafer, 280 through a spatial light modulator 274 and associated imaging optics 276. FIG. 22A is a front view, and FIG. 22B a side view of such an embodiment. Individual elements 278 of the spatial light modulator 274 can be respectively made transmissive or opaque to the visible light from the light source 272 as controlled by an appropriate control circuit 275. Hence, corresponding individual elements of the wafer 280 can also be made opaque or transmissive to MMW radiation directed to the wafer 280 through waveguide 270.

The spatial light modulator 274 may take many forms, ranging from an array of mechanical shutters, to an array of non-mechanical shutters. A non-mechanical shutter is made, e.g, by using a liquid crystal array that selectively forms dark or light areas or pixels, as controlled by a small electrical current, through which the visible light may pass.

Figure 23A:
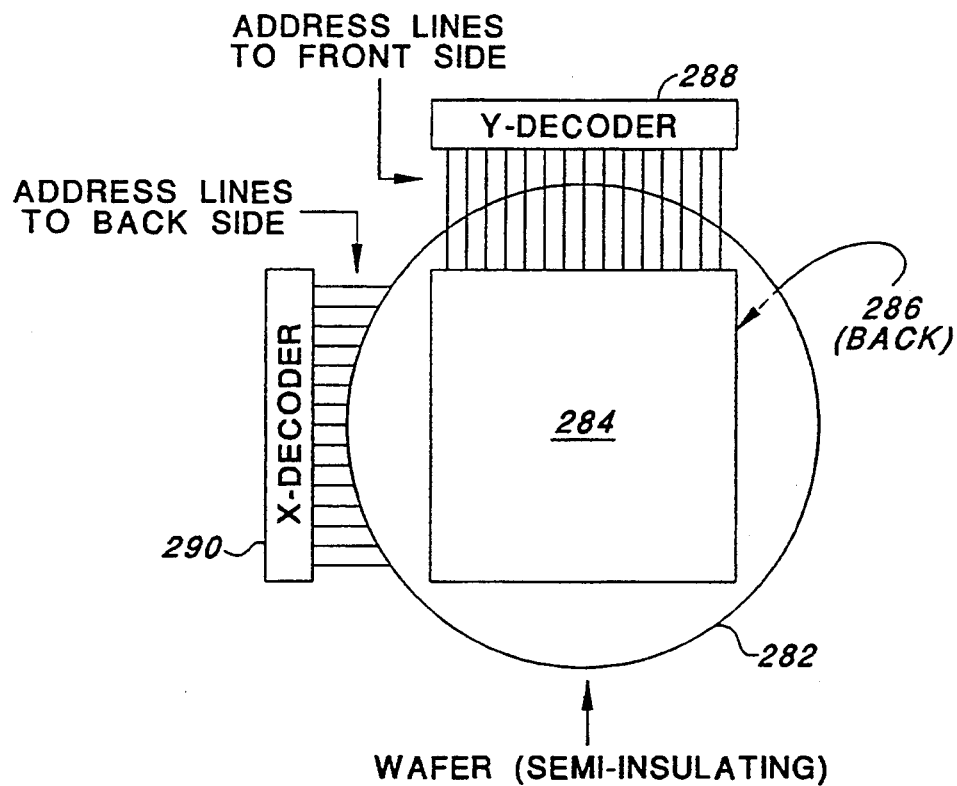
FIG. 23A shows another alternative embodiment of a beam deflector made in accordance with the invention showing the use of a semi-insulating semiconductor wafer that is patterned with a programmable two-dimensional array of current injecting contacts for selectively inducing a desired spatial light pattern directly in the wafer.
Figure 23B:
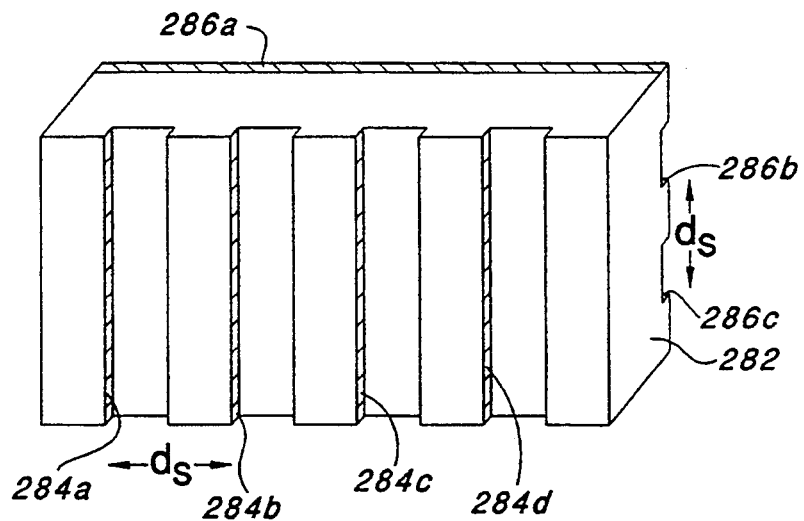
FIG. 23B is an exploded view of a portion of the wafer of FIG. 23A.

In addition to light modulation, as described above, other means may also be used to produce the spatially varying distribution of charge carriers in the semiconductor body. In particular, charge carriers may be injected directly into the semiconductor body in order to produce the desired spatial distribution of charge carriers. One way of accomplishing such injection is shown in FIGS. 23A and 23B. FIG. 23A, for example, shows an alternative embodiment of a beam deflector made in accordance with the invention that uses a semi-insulating semiconductor wafer 282 that is patterned with a programmable two-dimensional array of current injecting contacts. One two-dimensional array of contacts 284 is diffused into one surface of the wafer 282, and the other two-dimensional array of contacts 286 is diffused into the other opposing surface of the wafer 282. As configured in FIG. 23A, the array 284 functions as the "Y" contacts, and the array 286 functions as the "X" contacts.

As seen in FIG. 23B, which is an exploded view of a portion of the wafer 282, the array of contacts 284 comprises a series of conductors 284a, 284b, 284c, ..., each made from a thin n-type diffused layer. The array of contacts 286 comprises a series of conductors 286a, 286b, 286c, ..., each made from a thin p-type diffused layer. The conductors 284a, 284b, 284c, ... are non-parallel to the conductors 286a, 286b, 286c, .... Where the two sets of conductors cross and are separated by a narrow region of semi-insulating wafer material, they form a controllable current injecting contact. The diffused conductors must be spaced a distance $d_s$ that is wide enough so that the incident electromagnetic radiation can readily pass through the conductors. In analogy with the wavelength cutoff condition in a waveguide, the minimum conductor spacing is approximately $d_s = \lambda/2$ where $\lambda$ is the wavelength of the MMW radiation. An additional desirable embodiment is to orient the conductors with their edges to the incident MMW radiation, as shown in FIG. 23B.

The thickness of the wafer 282 is made to be smaller than or about the same size as the pixel spacing so as to minimize cross talk between contact areas which are not opposing each other, but is also made large enough so that the distribution of injected current is wide enough to give a pixel width approximately equal to $d_s$, the inter-conductor spacing. The "pixel" size of the wafer is thus about $d_s \times d_s$.

In operation, when opposing contacts are given a forward bias voltage on their respective conductors, electrons flow from one contact and holes from the other. The presence of the charge carriers attenuates the incident MMW radiation just as in the case of the photo-generated charge carriers described above. Advantageously, the conductors are individually addressable by use of external decoders 288 and 290. In one example of an addressing method, one set of conductors (the "word line") is given a bias voltage sequentially and the other set (the "bit line") is either given a bias voltage or not depending on which pixels on a word line are to be turned on. The refresh time for a given row need only be shorter than or on the order of a free carrier re-combination time for the wafer. Other address schemes and additional address lines can easily be incorporated by one skilled in the art. Hence, it is thus seen that any selected portion of the wafer 282 can be made transmissive or opaque to the incoming MMW radiation, thereby forming a diffractive lens that is easily reconfigurable.

Thus, it is seen that one embodiment of the invention is a MMW beam deflector made from a semiconductive lens, having opposing diffused contact layers, that controls the diffraction and or transmission of MMW radiation through such lens by directly controlling the injection of charge carriers into the semiconductive lens.

While the invention described herein has been described with reference to particular embodiments and applications thereof, numerous variations and modifications could be made thereto by those skilled in the art without departing from the spirit and scope of the invention as claimed.

What is claimed is:

1. A millimeter wave (MMW) beam deflector comprising:
    a semiconductor body;
    means for selectively injecting a spatially varying distribution of charge carriers in said semiconductor body; and
    means for directing MMW radiation from a MMW source through said semiconductor body, said MMW radiation having a wavelength of from 1 cm to 30 $\mu$m, the transmission of said MMW radiation through said semiconductor body being selectively attenuated by the spatial distribution of charge carriers in said semiconductor body so as to form a beam of MMW radiation that is scannable in space as a function of the spatially varying distribution of charge carriers.

2. The MMW beam deflector as set forth in claim 1 wherein said means for selectively injecting a spatially varying distribution of charge carriers in said semiconductor body comprises:
    an optical mask having a desired pattern formed thereon that blocks illuminating electromagnetic radiation from passing therethrough, said optical mask being made from a material that allows said MMW radiation to readily pass therethrough; said illuminating electromagnetic radiation having a wavelength less than a first prescribed wavelength; and
    means for illuminating said semiconductor body with said illuminating electromagnetic radiation;
    whereby selected portions of said semiconductor body are illuminated with said illuminating radiation as controlled by said optical mask, said illuminating radiation causing the selected portions of said semiconductor body to exhibit an increase in electrical conductivity, which increase in electrical conductivity affects the MMW radiation passing through said selected portions.

3. The MMW beam deflector as set forth in claim 2 wherein
    the desired pattern on said optical mask comprises concentric bands that alternate between being transmissive and opaque to said illuminating electromagnetic radiation; and further wherein
    the conductivity of said semiconductor body increases sufficiently when illuminated by said illuminating radiation to block said MMW radiation from passing through said semiconductor body;
    said concentric bands being appropriately sized and spaced so as to create corresponding concentric bands or regions of conductivity and non-conductivity within said semiconductor body that allow only MMW radiation to pass through said semiconductor body that constructively interferes at a specified detection point away from said semiconductor body;
    whereby a beam of MMW radiation is created at said detection point.

4. The MMW beam deflector as set forth in claim 3 wherein the concentric bands on said optical mask are symmetric, causing the detection point to be on-axis with a central axis of said mask.

5. The MMW beam deflector as set forth in claim 3 wherein the concentric bands on said optical mask are asymmetric, causing the detection point to be off-axis from a central axis of said mask.

6. The MMW beam deflector as set forth in claim 1 wherein said means for selectively injecting a spatially varying distribution of charge carriers in said semiconductor body comprises:
    an array of radiative sources, each radiative source of said array producing illuminating electromagnetic radiation having a wavelength less than a first prescribed wavelength, said first prescribed wavelength being less than the shortest wavelength of said MMW radiation;
    imaging means for directing the electromagnetic radiation from each of the radiative sources of said array to respective pixel areas on said semiconductor body; and
    energizing means for controllably energizing selected groupings of said radiative sources on said array so as to produce illuminating electromagnetic radiation that is directed to selected pixel areas on said semiconductor body;
    whereby the selected pixel areas on said semiconductor body are made conductive in a manner controlled by said energizing means; and
    further whereby the MMW radiation passing through said semiconductor body is appropriately affected by said selected conductive pixel areas so as to selectively control said MMW radiation.

7. The MMW beam deflector as set forth in claim 6 wherein said array of radiative sources comprises an LED array.

8. The MMW beam deflector as set forth in claim 1 wherein said means for selectively injecting a spatially varying distribution of charge carriers in said semiconductor body comprises:
    a radiative source emitting electromagnetic radiation having a wavelength less than a first prescribed wavelength, said first prescribed wavelength being less than the shortest wavelength of said MMW radiation;
    a spatial modulator spaced between said radiative source and said semiconductor body, said spatial modulator including means for inserting a prescribed pattern that is selectively opaque to said electromagnetic radiation between said radiative source and said semiconductor body, whereby the radiation emitted from said radiative source is selectively limited to the prescribed pattern defined by said spatial modulator;

imaging means for directing the electromagnetic radiation passing through said spatial modulator to respective pixel areas on said semiconductor body; and control means for controlling the spatial modulator in a way that creates the prescribed pattern;

whereby the respective pixel areas on said semiconductor body are made conductive in a manner controlled by said control means; and further whereby the MMW radiation passing through said semiconductor body is appropriately affected by the conductive pixel areas so as to selectively control said MMW radiation.

9. The MMW beam deflector as set forth in claim 8 wherein said spatial modulator includes a liquid crystal array comprising an ordered array of elements, each element of which may selectively be made transmissive or opaque to said electromagnetic radiation.

10. The MMW beam deflector as set forth in claim 9 wherein the electromagnetic radiation emitted by said radiative source comprises light of short enough wavelength to produce charge carriers in said semiconductor material.

11. The MMW beam deflector as set forth in claim 1 wherein said means for selectively injecting a spatially varying distribution of charge carriers in said semiconductor body includes:

first and second opposing two-dimensional arrays of contacts on either side of said semiconductor body; and means for applying a voltage bias to selected opposing contacts of said first and second opposing arrays of contacts, which forward bias voltage causes electrons and holes to flow between said opposing contacts;

whereby the region of said semiconductor body in which said electrons and holes flow becomes conductive and forms a pixel area through which the transmission of said MMW radiation is affected.

12. The MMW beam deflector as set forth in claim 11 wherein said first two-dimensional array of contacts comprises a first layer of substantially parallel n-type conductors placed in one side of said semiconductor body, and wherein said second two-dimensional array of contacts comprises a second layer of substantially parallel p-type conductors placed in the other side of said semiconductor body, said first layer conductors being non-parallel to said second layer conductors, the spacing between said conductors of said first and second layers being at least $\lambda/2$, where $\lambda$ is the wavelength of the MMW radiation.

13. The MMW beam deflector as set forth in claim 12 wherein said first and second layers of conductors are diffused into opposing sides of said semiconductor body.

14. A method of forming a beam of millimeter wave (MMW) radiation comprising:

directing MMW radiation through a semiconductor body, said MMW radiation having a wavelength of from 1 cm to 30 $\mu$m; and injecting a spatially varying distribution of charge carriers into selected pixel areas of said semiconductor body, said spatially varying distribution of charge carriers causing the selected pixel areas of said semiconductor body to become conductive and attenuate any MMW radiation passing therethrough;

selecting the pixel areas injected with said charge carriers so as to form a beam of MMW radiation at a detection point, with all rays of said MMW radiation that arrive at said detection point in phase having traveled a path length differing only by an approximately integral number of wavelengths.

15. The method as set forth in claim 14 further including adaptively adjusting the injection of said charge carriers into said semiconductor body so as to change the location of the detection point, whereby said formed beam of MMW radiation may be steered through space.

16. The method as set forth in claim 14 wherein the step of injecting a spatial distribution of charge carriers into said semiconductor body comprises irradiating the selected pixel areas of said semiconductor body with electromagnetic radiation having a wavelength less than a prescribed wavelength.

17. The method as set forth in claim 16 wherein the step of irradiating the selected pixel areas of said semiconductor body comprises selectively masking electromagnetic radiation from a continuous radiative source and directing the masked radiation to the semiconductor body.

18. The method as set forth in claim 16 wherein the step of irradiating the selected pixel areas of said semiconductor body comprises irradiating selected radiative elements of an array of radiative elements and directing an image of said array onto said semiconductor body.

19. The method as set forth in claim 16 wherein the step of irradiating the selected pixel areas of said semiconductor body comprises applying an electrical bias to opposing sides of the selected pixel areas, which electrical bias causes electrons and holes to flow in the semiconductor body within said pixel areas.

* * * * *